(12) United States Patent
Nguyen et al.

(10) Patent No.: US 9,437,320 B1
(45) Date of Patent: Sep. 6, 2016

(54) JOINT DETECTING AND DECODING SYSTEM FOR NONVOLATILE SEMICONDUCTOR MEMORY WITH REDUCED INTER-CELL INTERFERENCE

(71) Applicant: Marvell International LTD., Hamilton (BM)

(72) Inventors: Phong Sy Nguyen, Ho Chi Minh (VN); Shashi Kiran Chilappagari, San Jose, CA (US)

(73) Assignee: Marvell International LTD., Hamilton (BM)

( * ) Notice: Subject to any disclaimer, the term of this patent is extended or adjusted under 35 U.S.C. 154(b) by 0 days.

(21) Appl. No.: 14/687,267

(22) Filed: Apr. 15, 2015

Related U.S. Application Data

(60) Provisional application No. 61/979,933, filed on Apr. 15, 2014.

(51) Int. Cl.
*G11C 16/04* (2006.01)
*G11C 16/34* (2006.01)
*G11C 11/56* (2006.01)

(52) U.S. Cl.
CPC ......... *G11C 16/349* (2013.01); *G11C 11/5621* (2013.01)

(58) Field of Classification Search
None
See application file for complete search history.

(56) References Cited

U.S. PATENT DOCUMENTS

| | | | |
|---|---|---|---|
| 2011/0197015 A1* | 8/2011 | Chae | G11C 11/5642 711/103 |
| 2012/0224421 A1* | 9/2012 | Litsyn | G11C 16/349 365/185.03 |
| 2013/0176780 A1* | 7/2013 | Alhussien | G11C 11/5642 365/185.03 |
| 2014/0281819 A1* | 9/2014 | Wood | G11C 16/349 714/773 |

* cited by examiner

*Primary Examiner* — Son Dinh
*Assistant Examiner* — Sultana Begum

(57) ABSTRACT

A system including a receiving module to receive data from cells of memory, each cell storing multiple bits, each bit corresponding to a different type of page of the memory, the bits stored in a cell denoting a state of the cell, and the data including bits from a page of the memory or states of cells along a word line of the memory. A processor generates a reliability indication for a first portion of the data corresponding to a first cell based on the first portion of the data and one or more second portions of the data corresponding to one or more of the cells that are adjacent to the first cell. A decoder decodes the first portion of the data based on the first portion of the data and the reliability indication for the first portion of the data.

16 Claims, 20 Drawing Sheets

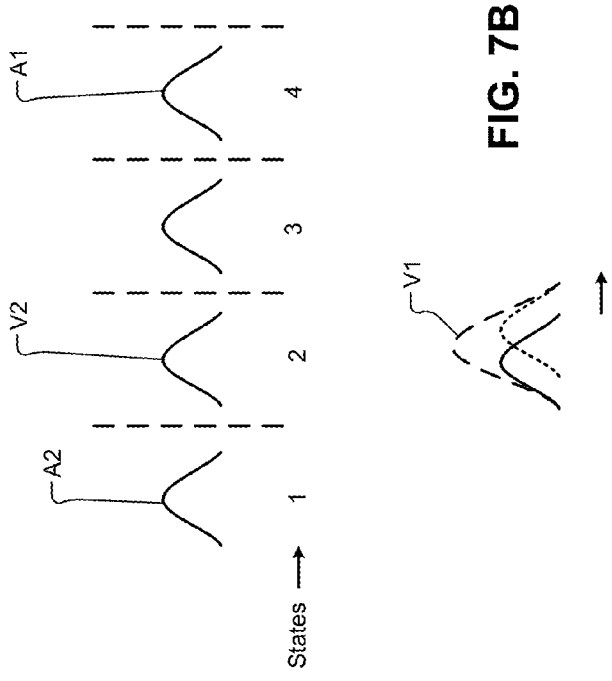
FIG. 7B
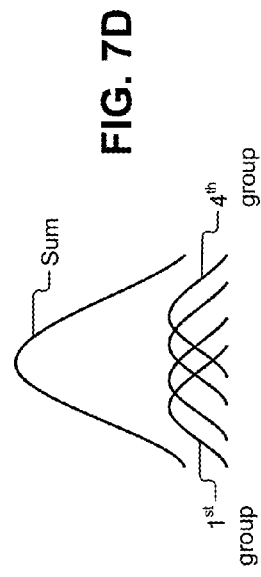
FIG. 7D
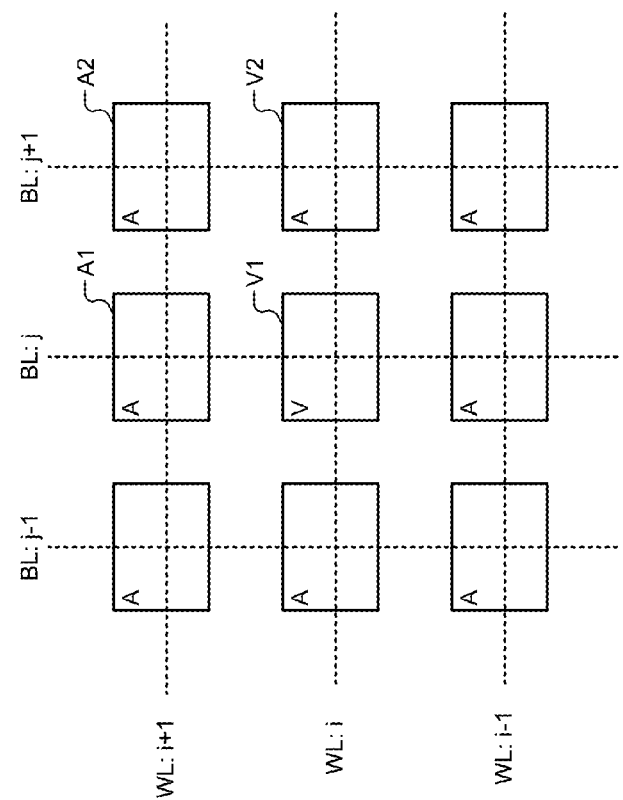
FIG. 7A
FIG. 7C

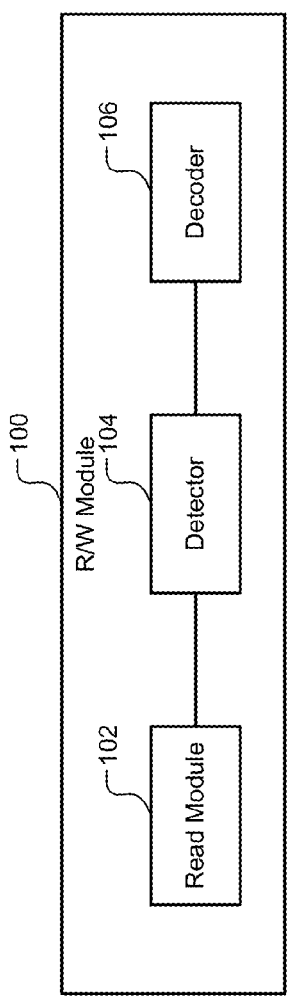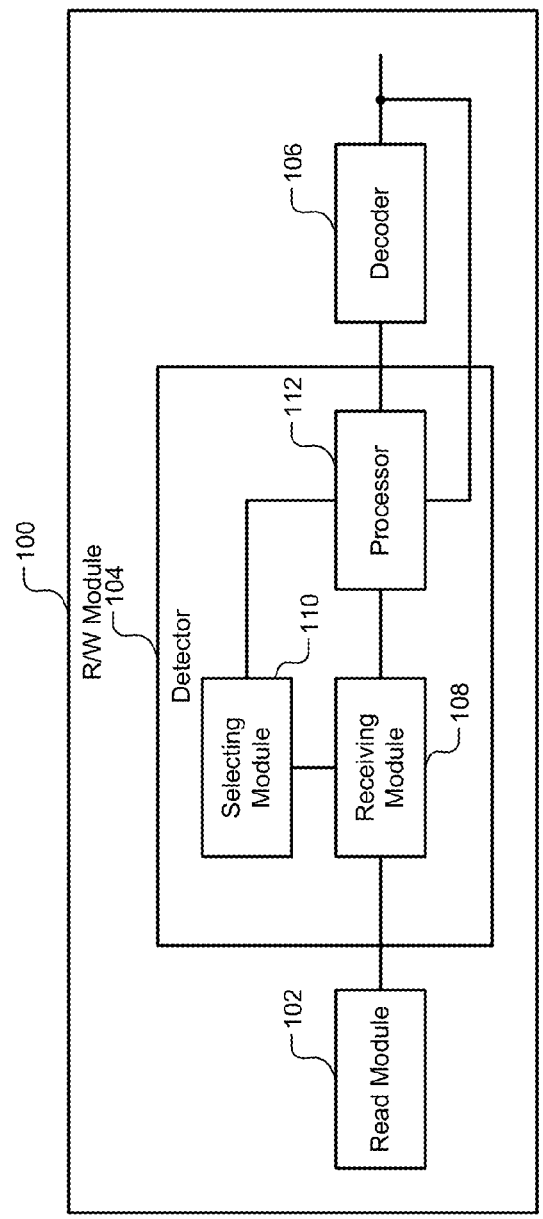

| Input to Detector | | | Output to Decoder | |
|---|---|---|---|---|
| Left bit | Current bit | Right bit | Hard bit | Soft bit |
| 0 | 0 | 0 | 0 | 0 |
| 0 | 0 | 1 | 0 | 1 |
| 1 | 0 | 0 | 0 | 1 |
| 1 | 0 | 1 | 0 | 1 |
| 0 | 1 | 0 | 1 | 1 |
| 0 | 1 | 1 | 1 | 1 |
| 1 | 1 | 0 | 1 | 1 |
| 1 | 1 | 1 | 1 | 0 |

FIG. 15B

| Input to Detector | | | Output to Decoder | | | | | |
|---|---|---|---|---|---|---|---|---|
| 1st bit | 2nd bit | 3rd bit | 1st hard bit | 1st soft bit | 2nd hard bit | 2nd soft bit | 3rd hard bit | 3rd soft bit |
| 0 | 0 | 0 | 0 | 1 | 0 | 0 | 0 | 1 |
| 0 | 1 | 0 | 0 | 0 | 1 | 0 | 0 | 1 |
| 1 | 1 | 0 | 1 | 0 | 1 | 1 | 0 | 0 |
| 1 | 1 | 1 | 1 | 0 | 1 | 0 | 1 | 0 |
| 0 | 1 | 1 | 0 | 0 | 0 | 0 | 1 | 1 |
| 0 | 0 | 1 | 1 | 0 | 0 | 1 | 1 | 1 |
| 1 | 0 | 1 | 0 | 0 | 0 | 1 | 1 | 0 |
| 1 | 0 | 0 | 1 | 1 | 0 | 1 | 0 | 0 |

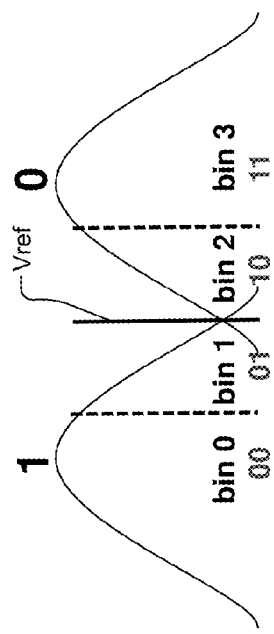
FIG. 19A
FIG. 19B
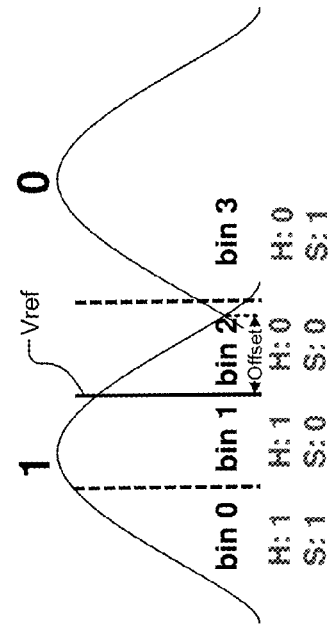
FIG. 21A
FIG. 21B

JOINT DETECTING AND DECODING SYSTEM FOR NONVOLATILE SEMICONDUCTOR MEMORY WITH REDUCED INTER-CELL INTERFERENCE

CROSS-REFERENCE TO RELATED APPLICATIONS

This application claims the benefit of U.S. Provisional Application No. 61/979,933, filed on Apr. 15, 2014. The entire disclosures of the applications referenced above are incorporated herein by reference.

FIELD

The present disclosure relates generally to semiconductor memory and more particularly to systems and methods for jointly detecting and decoding data from nonvolatile semiconductor memory.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Memory integrated circuits (ICs) comprise memory arrays. The memory arrays include memory cells arranged in rows and columns. The memory cells may include cells of volatile or nonvolatile memory. Volatile memory loses data stored in the memory cells when power is removed from the memory cells. Nonvolatile memory retains data stored in the memory cells when power is removed from the memory cells.

The memory cells in the rows and columns of a memory array are addressed by word lines (WLs) that select the rows and bit lines (BLs) that select the columns. The memory ICs comprise WL and BL decoders that select the WLs and BLs, respectively, during read/write (R/W) and erase/program (EP) operations.

In FIG. 1, a memory IC 10 comprises a memory array 12, a WL decoder 16, a BL decoder 18, and a read/write (R/W) module 19. The memory array 12 comprises memory cells 14 arranged in rows and columns as shown. The WL and BL decoders 16, 18 respectively select the WLs and BLs depending on the addresses of the memory cells 14 selected during R/W and EP operations.

The R/W module 19 receives commands (e.g., read, write, erase, program, etc.) from a host (not shown). The R/W module 19 reads and writes data in the selected memory cells 14. Additionally, the R/W module 19 erases and programs the selected memory cells 14 (e.g., in one or more blocks or pages) when the memory cells 14 include cells of nonvolatile memory such as flash memory.

For example only, the memory cells 14 may include cells of NAND or NOR flash memory. Each memory cell 14 may be programmed to store N binary digits (bits) of information, where N is an integer greater than or equal to 1. Accordingly, each memory cell 14 may have $2^N$ states. To store N bits per cell, each memory cell 14 may comprise a transistor having $2^N$ programmable threshold voltages (hereinafter threshold voltages). The $2^N$ threshold voltages of the transistor represent the $2^N$ states of the memory cell 14, respectively.

In FIG. 2, a memory cell 14-$i$ may comprise a transistor 50 having a threshold voltage $V_T$. The transistor 50 may comprise a floating gate G (hereinafter gate G), a source S, and a drain D. The amount of charge stored in the gate G during a write operation determines the value of threshold voltage $V_T$ and the state of the memory cell 14-$i$.

For example only, the transistor 50 may have two programmable threshold voltages VT1 and VT2 depending on the amount of charge stored in the gate G. When the amount of charge stored in the gate G is G1, the threshold voltage of the transistor 50 is VT1. When the amount of charge stored in the gate G is G2, the threshold voltage of the transistor 50 is VT2. Depending on the amount of charge stored in the gate G, a gate voltage (i.e., VGS) having a value greater than or equal to VT1 or VT2 may turn on the transistor 50 (i.e., generate a predetermined drain current).

The state of the memory cell 14 (i.e., data stored in the memory cell 14) is read by measuring the threshold voltage $V_T$ of the transistor 50. The threshold voltage $V_T$ cannot be read out directly. Instead, the threshold voltage $V_T$ is measured by applying the gate voltage to the gate G and sensing the drain current. The drain current is sensed by applying a small voltage across the source S and the drain D of the transistor 50.

When the gate voltage is less than the threshold voltage $V_T$, the transistor 50 is off, and the drain current is low (approximately zero). Conversely, when the gate voltage is greater than or equal to the threshold voltage $V_T$, the transistor 50 turns on, and the drain current becomes high (i.e., equal to the predetermined drain current corresponding to the $V_T$). The value of the gate voltage that generates the high drain current represents the threshold voltage $V_T$ of the transistor 50.

Typically, states of memory cells in a block or a page of a memory array are sensed at a time. The gates of the transistors of the memory cells in the block are connected to a WL. The WL is selected, and a voltage is applied to the WL. The states of N-bit memory cells are sensed by stepping through ($2^N-1$) voltages on the WL and determining the threshold voltages of the transistors when the drain currents of the transistors first exceed a predetermined (preprogrammed) value.

In FIGS. 3A and 3B, the threshold voltage of the transistor 50 is measured as follows. For example only, the transistor 50 may have one of four threshold voltages $V_{T1}$ to $V_{T4}$, where $V_{T1} < V_{T2} < V_{T3} < V_{T4}$. Accordingly, the memory cell 14-$i$ may have one of four states: 00, 01, 10, and 11.

In FIG. 3A, the R/W module 19 comprises a voltage generator 20 and current sensing amplifiers 22. The number of current sensing amplifiers is equal to the number of BLs. For example, when the IC 10 comprises B BLs, the current sensing amplifiers 22 include B current sensing amplifiers for B BLs, respectively, where B is an integer greater than 1.

In FIG. 3B, the WL decoder 16 selects a WL comprising memory cells 14-1, 14-2, ..., 14-$i$, ..., and 14-$n$ (collectively, memory cells 14) when the states of the memory cells are to be determined. Each of the memory cells 14 includes a transistor similar to the transistor 50. The transistors are shown as capacitances C that store the charge in the gates.

When a read operation begins, the voltage generator 20 supplies a voltage (e.g., a staircase voltage) to the WL decoder 16. The WL decoder 16 inputs the voltage to the selected WL. Accordingly, the voltage is applied to the gates of the transistors on the selected WL.

The current sensing amplifiers 22 include one current sensing amplifier for each BL. For example, a current sensing amplifier 22-$i$ communicates with a bit line BL-$i$ and senses the drain current that flows through the transistor 50 of the memory cell 14-$i$. The current sensing amplifier 22-$i$ senses the drain current by applying a small voltage across the source and the drain of the transistor 50.

Each current sensing amplifier 22 senses the drain current through the respective one of the transistors of the memory cells 14. The R/W module 19 measures the threshold voltages of the transistors based on the drain currents sensed by the respective current sensing amplifiers 22.

SUMMARY

A system comprises a receiving module, a processor, and a decoder. The receiving module is configured to receive data from cells of memory. Each of the cells stores multiple bits. Each of the bits corresponds to a different type of page of the memory. The bits stored in one of the cells denote a state of the one of the cells. The data includes (i) bits from a page of the memory or (ii) states of cells along a word line of the memory. The processor is configured to generate a reliability indication for a first portion of the data corresponding to a first cell based on the first portion of the data and one or more second portions of the data corresponding to one or more of the cells that are adjacent to the first cell. The decoder is configured to decode the first portion of the data based on (i) the first portion of the data and (ii) the reliability indication for the first portion of the data.

In another feature, the decoder is configured to decode the first portion of the data based on an additional reliability indication for the first portion of the data received from the memory.

In other features, in response to the data including bits from a page of the memory, the first portion of the data includes a first bit corresponding to the first cell received from the page, the one or more second portions of the data include one or more bits corresponding to the one or more of the cells received from the page, and the processor is configured to generate the reliability indication for the first bit based on (i) the first bit and (ii) the one or more bits.

In other features, in response to the data including states of cells along a word line of the memory, the first portion of the data includes a first state of the first cell along the word line, the one or more second portions of the data includes one or more states of the one or more of the cells along the word line, and the processor is configured to generate a plurality of bits as the reliability indication for each of the bits of the first state based on (i) the bits of the first state and (ii) corresponding bits of the one or more states.

In another feature, the system further comprises a selecting module configured to select the first portion and the one or more second portions of the data using a sliding window.

In other features, the decoder is configured to generate feedback based on decoding the first portion of the data. The processor is configured to generate the reliability indication for the first portion of the data based on (i) the first portion and the one or more second portions of the data and (ii) the feedback. The decoder is configured to decode the first portion of the data based on (i) the first portion of the data and (ii) the reliability indication for the first portion of the data.

In other features, the decoder is configured to generate feedback based on decoding the first portion of the data. The processor is configured to update the reliability indication for the first portion of the data based on the feedback. The decoder is configured to decode the first portion of the data based on (i) the first portion of the data and (ii) the updated reliability indication for the first portion of the data.

In other features, the processor is configured to generate a plurality of bits as reliability indications for bits of a first state of a first cell based on (i) the bits of the first state and (ii) corresponding bits of one or more states of the first cell that are adjacent to the first state of the first cell. The decoder is configured to decode the first state of the first cell based on (i) the first state of the first cell received from the data and (ii) the reliability indications for the bits of the first state of the first cell.

In still other features, a system comprises a receiving module, a processor, and a decoder. The receiving module is configured to receive information about a bin in which a threshold voltage of a cell of a memory lies in response to reading the cell by applying a reference voltage. The bin is one of a plurality of bins in which a threshold voltage distribution of the cell is divided. The processor is configured to generate a first bit corresponding to a state of the cell and a second or more bits indicating reliability of the first bit based on the information about the bin. A value of the first bit is based on the threshold voltage and one or more reference voltages. A value of the second or more bits is based on the threshold voltage and the one or more reference voltages. The decoder is configured to decode the first bit based on (i) the first bit and (ii) the second or more bits.

In still other features, a system comprises a receiving module, a processor, and a decoder. The receiving module is configured to receive (i) a first bit corresponding to a state of a cell of a memory, (ii) a second or more bits indicating reliability of the first bit, and (iii) other bits that form the state of a cell. The receiving module is configured to collect bin counts indicating a number of cells having threshold voltages lying in a plurality of bins when the cells are read by applying a first reference voltage. Each of the bins represents a different portion of a threshold voltage distribution of the cells. The processor is configured to adjust the first reference voltage to a second reference voltage by an amount based on the bin counts. The processor is configured to modify one or more of the first bit and the second or more bits based on a position of the second reference voltage relative to a bin corresponding to the first bit and the second or more bits. The decoder is configured to decode the first bit based on the modified one or more of the first bit and the second or more bits output by the processor.

In still other features, a method comprises receiving data from cells of memory. Each of the cells stores multiple bits. Each of the bits corresponds to a different type of page of the memory. The bits stored in one of the cells denote a state of the one of the cells. The data includes (i) bits from a page of the memory or (ii) states of cells along a word line of the memory. The method further comprises generating a reliability indication for a first portion of the data corresponding to a first cell based on the first portion of the data and one or more second portions of the data corresponding to one or more of the cells that are adjacent to the first cell. The method further comprises decoding the first portion of the data based on (i) the first portion of the data and (ii) the reliability indication for the first portion of the data.

In another feature, the method further comprises decoding the first portion of the data based on an additional reliability indication for the first portion of the data received from the memory.

In other features, in response to the data including bits from a page of the memory, the first portion of the data includes a first bit corresponding to the first cell received from the page, and the one or more second portions of the data include one or more bits corresponding to the one or more of the cells received from the page, and the method further comprises generating the reliability indication for the first bit based on (i) the first bit and (ii) the one or more bits.

In other features, in response to the data including states of cells along a word line of the memory, the first portion of the data includes a first state of the first cell along the word line, and the one or more second portions of the data includes one or more states of the one or more of the cells along the word line, and the method further comprises generating a plurality of bits as the reliability indication for each of the bits of the first state based on (i) the bits of the first state and (ii) corresponding bits of the one or more states.

In another feature, the method further comprises selecting the first portion and the one or more second portions of the data using a sliding window.

In other features, the method further comprises generating feedback based on decoding the first portion of the data, generating the reliability indication for the first portion of the data based on (i) the first portion and the one or more second portions of the data and (ii) the feedback, and decoding the first portion of the data based on (i) the first portion of the data and (ii) the reliability indication for the first portion of the data.

In other features, the method further comprises generating feedback based on decoding the first portion of the data, updating the reliability indication for the first portion of the data based on the feedback, and decoding the first portion of the data based on (i) the first portion of the data and (ii) the updated reliability indication for the first portion of the data.

In other features, the method further comprises generating a plurality of bits as reliability indications for bits of a first state of a first cell based on (i) the bits of the first state and (ii) corresponding bits of one or more states of the first cell that are adjacent to the first state of the first cell, and decoding the first state of the first cell based on (i) the first state of the first cell received from the data and (ii) the reliability indications for the bits of the first state of the first cell.

In still other features, a method comprises receiving information about a bin in which a threshold voltage of a cell of a memory lies in response to reading the cell by applying a reference voltage. The bin is one of a plurality of bins in which a threshold voltage distribution of the cell is divided. The method further comprises generating a first bit corresponding to a state of the cell and a second or more bits indicating reliability of the first bit based on the information about the bin. A value of the first bit is based on the threshold voltage and one or more reference voltages. A value of the second or more bits is based on the threshold voltage and the one or more reference voltages. The method further comprises decoding the first bit based on (i) the first bit and (ii) the second or more bits.

In still other features, a method comprises receiving (i) a first bit corresponding to a state of a cell of a memory, (ii) a second or more bits indicating reliability of the first bit, and (iii) other bits that form the state of a cell. The method further comprises collecting bin counts indicating a number of cells having threshold voltages lying in a plurality of bins when the cells are read by applying a first reference voltage. Each of the bins represents a different portion of a threshold voltage distribution of the cells. The method further comprises adjusting the first reference voltage to a second reference voltage by an amount based on the bin counts, and modifying one or more of the first bit and the second or more bits based on a position of the second reference voltage relative to a bin corresponding to the first bit and the second or more bits. The method further comprises decoding the first bit based on the modified one or more of the first bit and the second or more bits.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

FIG. 7A shows a victim cell and a plurality of aggressor cells in a memory array;

FIG. 7B shows effects of aggressor cells on a threshold voltage distribution of a victim cell;

FIG. 7C shows an overall threshold voltage distribution of victim cells when the victim cells are unaffected by aggressor cells;

FIG. 7D shows an overall threshold voltage distribution of victim cells when the victim cells are affected by aggressor cells;

FIGS. 13A and 13B show a block diagram of a read/write (R/W) module that jointly detects and decodes data from memory cells of a memory array shown in FIG. 1.

FIG. 15B shows a table used by the detector for a first method shown in FIGS. 13A and 13B.

FIG. 19A shows a threshold voltage distribution and corresponding bin information processed by the detector shown in FIGS. 13A and 13B for a third method.

FIG. 19B shows a table used by the detector shown in FIGS. 13A and 13B when processing the information shown in FIG. 19A.

FIG. 21A shows a threshold voltage distribution and corresponding bin information processed by the detector shown in FIGS. 13A and 13B for a fourth method.

FIG. 21B shows a table used by the detector shown in FIGS. 13A and 13B when processing the information shown in FIG. 21A.

In the drawings, reference numbers may be reused to identify similar and/or identical elements.

DESCRIPTION

Figure 2:
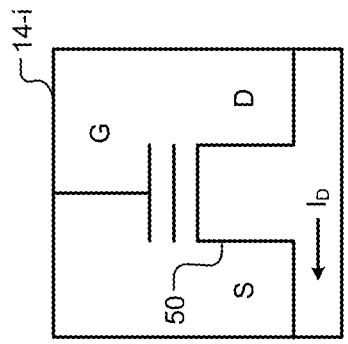
FIG. 2 is a schematic of a multi-level memory cell.

The present disclosure relates to jointly detecting and decoding data from nonvolatile semiconductor memory (e.g., NAND flash). Four different schemes are disclosed. Briefly, in a first scheme, a detector/preprocessor (hereinafter detector) performs inter-cell interference cancellation (ICIC) on page-level or wordline-level depending on the type of information available. In a second scheme, when wordline-level information is available, the detector can process each cell state/symbol and assign reliability to the bits that form the corresponding cell state/symbol based on the Gray mapping being used. In a third scheme, when hard and soft information from the memory is not ready for use by the decoder, the detector can map the information received from the memory to a format that the decoder can use. In a fourth scheme, the detector can also collect a histogram of cell voltage distribution from the memory. For example, the detector can collect bin counts based on the information read from memory. Then the detector can calibrate the reference voltage ($V_{ref}$) used to read the memory cells based on the bin counts and output modified hard bit and soft bit to the decoder based on an estimated $V_{ref}$ offset.

In each of the four schemes, the decoder can provide feedback to the detector, which can use the feedback, together with any reliability information received from the memory, to further modify the hard and soft information provided to the decoder to reduce read errors. Before describing the four schemes with references to FIGS. 9-22, threshold voltage distributions of flash memory cells, generating soft information including bin indexes and log-likelihood ratios for the memory cells, and inter-cell interference and inter-cell interference cancellation are described with references to FIGS. 4-8.

In some memory systems such as flash memory systems, memory cells store data by trapping granulized amounts of charge in an isolated region of a transistor called a floating gate. Data stored in a memory cell (e.g., a transistor as explained below) is read by applying a voltage to the transistor and estimating the readout current, which is determined by the amount of charge trapped. When the applied voltage is greater than or equal to the threshold voltage of the transistor, which is determined by the amount of charge trapped, the transistor turns on, and the readout current is high.

Memory cells may store one or more bits per cell and may be called single-level or multi-level memory cells, respectively. A single-level memory cell may store one bit of information. For example only, the bit may be logic 0 when charge is stored in the memory cell or logic 1 when no charge is stored in the memory cell.

The multi-level memory cells may store more than one bit of information by storing varying amounts of charge or charge levels. For example, suppose Q is the maximum amount of charge that can be trapped in a multi-level memory cell. More than one bit of information can be stored in such a memory cell by storing a granulized amount of charge between 0 and Q. For example only, two bits of information may be stored in one multi-level memory cell by trapping any one of four levels of charges: 0, Q/3, 2Q/3, Q.

The process of trapping charge is called programming. The various levels of trapped charges translate into different threshold voltages for the memory cell. The data stored in the memory cell can be read by estimating the amount of charge stored in the memory cell. The amount of charge stored in the memory cell is estimated by applying a voltage and reading the current. When the current becomes high, the applied voltage is compared to one of the reference voltages. The reference voltages correspond to various states and corresponding threshold voltages of the memory cell, which depend on the amount of charge trapped in the memory cell.

Figure 4A:
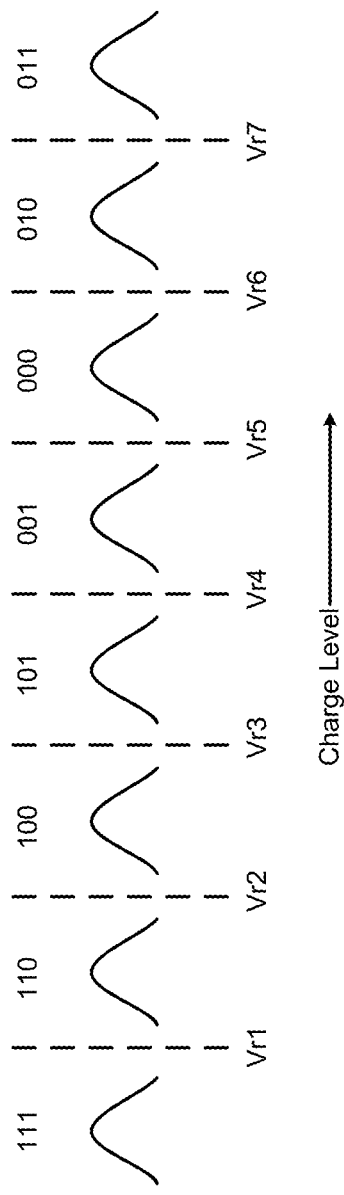
FIG. 4A depicts charge level distributions of a 3-bit memory cell.

In FIG. 4A, an example of a threshold voltage distribution for a 3-bit memory cell is shown. The 3-bit memory cell is used for example only. The discussion is applicable to any N-bit memory cell having $2^N$ nominal threshold voltages and ($2^N-1$) reference voltages, where N is an integer greater than 1.

The 3-bit memory cell can store up to eight different levels of charge, where each charge level corresponds to one of eight different states. Accordingly, the threshold voltage distribution of the memory cell includes eight different nominal threshold voltages. The eight nominal threshold voltages are associated with the eight levels of charge that can be stored in the memory cell, respectively. Although cells to be programmed to a desired state are programmed to a charge level corresponding to the desired state, the actual charge stored in the cell when the cell is programmed to the desired state can differ, and results in a distribution of the threshold voltage around the nominal threshold voltage. Accordingly, threshold voltages can have a distribution instead of a single value.

Intersections of adjacent charge levels define reference voltages that may be used to detect the data stored in the memory cell during read operations. Accordingly, the 3-bit memory cell has seven reference voltages ($V_{r1}$ through $V_{r7}$) that are located where adjacent distribution curves intersect.

The reference voltages should be known during a read operation to determine the level of charge and consequently the data stored in the memory cell. Initially, the reference voltages are set at the time of manufacture. Subsequently, during normal read operations, the threshold voltage of the memory cell is measured (by applying a voltage to the gate and measuring the drain current) and compared to the seven reference voltages to determine the data stored in the memory cell (i.e., the state of the memory cell).

For example only, when the threshold voltage is less than or equal to $V_{r1}$, the data stored in the memory cell is 111. When the threshold voltage is less than or equal to $V_{r2}$ and greater than $V_{r1}$, the data stored in the memory cell is 110, and so on. Finally, when the threshold voltage is greater than $V_{r7}$, the data stored in the memory cell is 011.

Figure 4B:
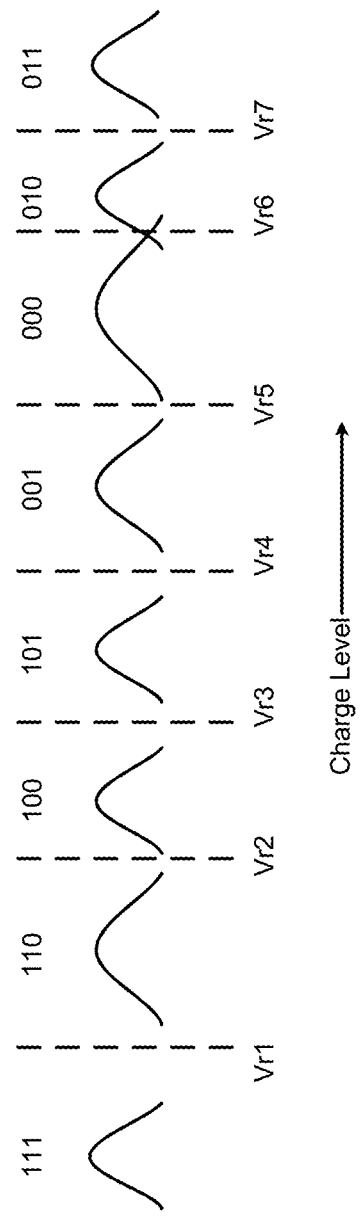
FIG. 4B depicts drifts in the charge level distributions of FIG. 4A due to cycling of the 3-bit memory cell.

In FIG. 4B, memory cells such as the multi-level flash memory cells may be subjected to charge retention loss after repeated read, write, erase, and/or program operations (collectively called cycling). For example, the oxide surrounding the floating gates of the memory cells may degenerate after repeated cycling. Consequently, the threshold voltage distributions may change or drift after cycling as shown. Accordingly, after cycling, data read using initial reference voltages from before cycling may be incorrect.

A read operation typically involves making a hard decision about the bits stored in memory cells. Consider a single-bit memory cell that can store either a 0 or a 1. Suppose the nominal threshold voltages corresponding to the stored values (i.e., states) 0 and 1 are $V_0$ and $V_1$, respectively. Without loss of generality, assume that $V_0 > V_1$. Since the single-bit memory cell can have two states 0 or 1, only one reference voltage $V_r$ set at the center of $V_0$ and $V_1$ is typically sufficient to detect the state of the single-bit memory cell.

The threshold voltages can vary over time due to usage, operating conditions (e.g., noise), and inter-cell interference (i.e., data currently being written in one cell affecting data previously written in a neighboring cell). If both the threshold voltages are subjected to similar noise conditions, the reference voltage $V_r$ can be set to the midpoint of $V_0$ and $V_1$ i.e., $V_r = 0.5*(V_0+V_1)$. It can be shown that this setting of $V_r$ is optimal from a bit error rate (BER) perspective. The threshold voltage of the cell (i.e., the voltage at which drain current is high) is compared to $V_r$. If the threshold voltage is greater than $V_r$, the cell is read as 0, and read as 1 otherwise. This is known as hard decision since the result of the read operation is a hard decision regarding the state of the memory cell.

Generally, memory cells in one block or one page are read at a time. That is, a voltage is applied to the memory cells in a page, and the cells are read as storing 0 or 1 depending on whether the threshold voltages of the cells are greater or less than the reference voltage. When noise levels are high or the threshold voltage distribution of the cells shifts due to usage and inter-cell interference, the hard decisions can be incorrect if the reference voltage is not adjusted to account for the noise or the shift. Error-correcting decoders may be used to correct some errors. Not all the errors, however, may be corrected.

Errors can be reduced by performing more reads instead of performing a single read when determining a threshold voltage of a memory cell. Specifically, additional reads can be performed using additional reference voltages to determine the threshold voltage. By performing more reads, more information can be collected about the data stored in the cells. The additional information collected by performing the additional reads is called soft information, which can be used by the decoder to correct errors.

Figure 5:
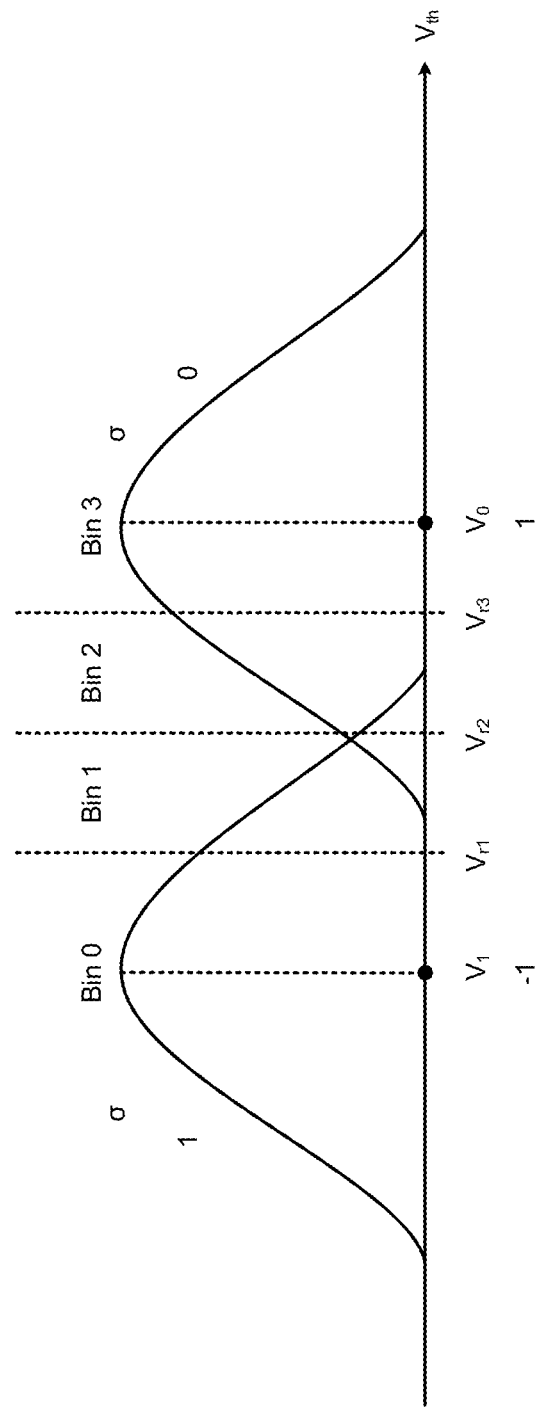
FIG. 5 depicts a threshold voltage distribution of a single-bit cell and reference voltages used to perform multiple read operations.

In FIG. 5, consider an example threshold voltage distribution of a single-bit cell that can store a 1 or a 0. The nominal voltage levels corresponding to the two states of the cell are denoted as −1 and 1, respectively. For example only, −1 and 1 may correspond to 1V and 4V, respectively. That is, in FIG. 5, $V_1$ and $V_0$ may be equal to 1V and 4V, respectively.

Assume that three reference voltages $V_{r1} < V_{r2} < V_{r3}$ are used in three read operations to determine the threshold voltage of the cell. That is, the voltage applied to the cell is compared to the three reference voltages to determine the threshold voltage of the cell. The three reference voltages partition the real line comprising the threshold voltage into four regions $R_1 = (-\infty, V_{r1}]$, $R_2 = (V_{r1}, V_{r2}]$, $R_3 = (V_{r2}, V_{r3}]$ and $R_4 = (V_{r3}, \infty)$. By performing three reads, the threshold voltage of the cell can be binned into one of the four regions or bins.

Cells having threshold voltages in bin 0 are more likely to have stored a −1, and cells having threshold voltages in bin 3 are more likely to have stored a 1. Cells having threshold voltages in bin 1 and bin 2, however, could have stored a −1 or a 1. The uncertainty about the states of the cells in bins 1 and 2 can be reduced by further increasing the number of reads. That is, the threshold voltage of a cell can be determined more accurately by increasing the number of reads. However, for practical purposes, the number of reads should be kept finite.

The concept of soft information is now explained. Suppose a threshold voltage of a cell is in bin 0. The probability P that the state of the cell is 1 (i.e., X=1) given that the threshold voltage read (i.e., Y) lies in bin 0 (i.e., Y∈bin 0) is expressed as P (X=1|Y∈bin 0). Similarly, the probability P that the state of the cell is −1 (i.e., X=−1) given that the threshold voltage read (i.e., Y) lies in bin 0 (i.e., Y∈bin 0) is expressed as P (X=−1|Y∈bin 0). If the threshold voltage of a cell is in bin 0, the probability P (X=−1|Y∈bin 0) is high relative to the probability P (X=1|Y∈bin 0).

These probabilities are computed for each cell, and log-likelihood ratios (LLRs) are calculated from these probabilities. Specifically, when a threshold voltage of a cell lies in one of the bins (i.e., when Y is known), a LLR can be computed to determine whether the actual threshold voltage (i.e., X) of the cell is 1 or −1. The LLR is expressed as log [P(X=1|Y)/P(X=−1|Y)]. P(X=1|Y) is the probability that the actual threshold voltage X of the cell is 1 given Y (i.e., with the threshold voltage read being in a given bin). P(X=−1|Y) is the probability that the actual threshold voltage X of the cell is −1 given Y (i.e., with the threshold voltage read being in a given bin). The sum of the probabilities P(X=1|Y) and P(X=−1|Y) is 1. That is, P(X=1|Y)+P(X=−1|Y)=1.

The LLR is positive if P(X=1|Y) is greater than P(X=−1|Y), and the LLR is negative if P(X=1|Y) is less than P(X=−1|Y). Accordingly, if the sign of LLR is positive, the actual threshold voltage of the cell is more likely to be 1, and if the sign of LLR is negative, the actual threshold voltage of the cell is more likely to be −1. The absolute value of the magnitude of the LLR indicates confidence in the result. Higher the absolute value of the magnitude, greater the confidence in the result. In other words, the sign of LLR indicates the hard decision, and the absolute value of the magnitude of the LLR indicates the reliability of the hard decision.

Thus, when a single read is performed to read a block of cells, the result is a stream of hard decisions 1's and −1's associated with the cells. On the other hand, when multiple reads are performed, the result is bin numbers associated with the cells. The states of the cells in right-most and left-most bins are 1's and −1's, respectively, with high reliability. Information about the states of the cells in the right-most and left-most bins is the soft information that can be used by the decoder in determining the states of remaining cells whose states are uncertain.

The reference voltages for multiple reads can be set as follows. In general, the process of performing t reads can be interpreted as dividing a real line on which the threshold voltages lie into (t+1) regions and binning the threshold voltage of a cell to one of the regions. More generally, this process can be interpreted as a channel with two inputs (−1 and 1) and (t+1) outputs (i.e., the (t+1) regions or bins). For example, as shown in FIG. 5, by performing three reads, the threshold voltage of a cell can be binned into one of the four regions or bins.

When calculating reference voltages, probabilities and LLRs associated with each bin are also calculated. The LLRs are assigned to respective bins. Like the reference voltages, the LLR values can be symmetrical around the center of the threshold voltage distribution. For example, the LLR value for bin 0 can be the same as the LLR value for bin 3 except for the change of sign. Similarly, the LLR value for bin 1 can be the same as the LLR value for bin 2 except for the change of sign, and so on.

Currently, LLRs are assigned based on a bin index. A bin index of a memory cell indicates a location of threshold voltage distribution of the memory cell. The location is relative to reference voltages used to read the memory cell. Memory cells having the same bin index are assigned the same LLR. To compensate for inter-cell interference, however, states of neighboring cells also need to be considered. Two cells with the same bin index can have different LLRs if neighboring cells of the two cells have different states.

Figures 6A, 6B:
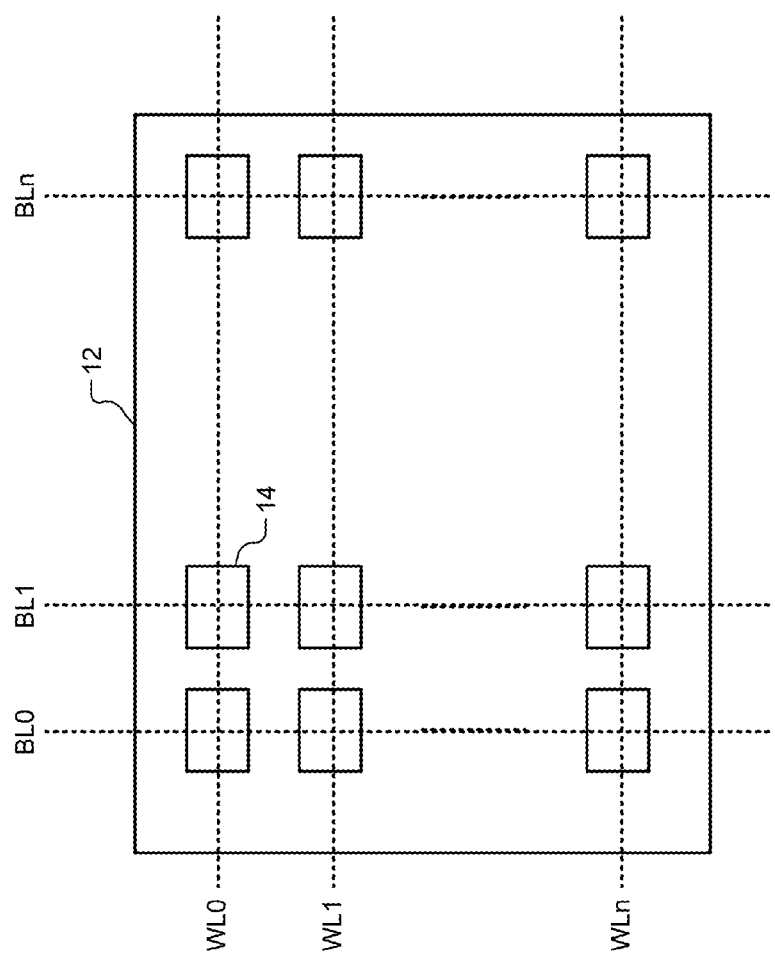
FIG. 6A depicts a memory array.
FIG. 6B shows a table for programming pages in the memory array of FIG. 6A.

In FIGS. 6A and 6B, the memory array 12 includes the memory cells 14 located along word lines WL0, WL1, . . . , WLn, and bit lines BL0, BL1, . . . , BLn as shown, where n is an integer greater than 1. Suppose, for example only, that the memory cells 14 store 2-bits per cell. Data is stored in the memory cells 14 in pages. Since the memory cells 14 store 2-bits per cell, each word line will be associated with 2 pages: a first page (e.g., page A) where a first bit of the 2-bits of each memory cell along a word line is stored; and a second page (e.g., page B) where a second bit of the two bits of each memory cell along the word line is stored.

The pages are generally programmed in a predetermined order. Manufacturers optimize the order of programming pages to minimize inter-cell interference. For example, the order may be as shown in FIG. 6B: pages 0, 1, 2, and 3 may be along word lines 0, 1, 2, and 3, respectively; pages 4, 5, 6, and 7 may be along word lines 0, 1, 2, and 3, respectively; pages 8 and 9 may be respectively along word lines 4 and 5; pages 10 and 11 may be respectively along word lines 4 and 5; and so on.

The pages are programmed in the following order: word line 0 is programmed to program page 0; word line 1 is programmed to program page 1; word line 2 is programmed to program page 2; word line 3 is programmed to program page 3; then word line 0 is programmed to program page 4; word line 1 is programmed to program page 5; and so on.

Accordingly, pages 0 and 4, instead of pages 0 and 1, will be along the word line 0. Instead, if pages 0 and 1 were along the word line 0, and if pages 2 and 3 were along the word line 1, pages 0 and 1 will be programmed first, followed by pages 2 and 3. Programming pages 2 and 3 after having programmed pages 0 and 1, however, will affect the data written in pages 0 and 1. Instead, if pages are programmed as shown in FIG. 6B, effect of data already written on page 1 along word line 1 can be taken into account while writing page 4 on word line 0.

Although the manufacturers optimize the order to minimize inter-cell interference, some inter-cell interference may still persist. The manufacturer's order is fixed for a device type. For example, a 3-bits-per-cell memory integrated circuit manufactured using 19 nanometer process may have a fixed programming order optimized for that device. Based on the manufacturer's order, the inter-cell interference in the device may follow a pattern. The pattern can be recognized and compensated.

Compensation data can be generated for the device after the device is manufactured and before a user begins using the device to store data. The compensation data can be added to the device before a user begins using the device to store data. The compensation data can be used to compensate inter-cell interference throughout the useful life of the device.

FIGS. 7A-7D are used to explain inter-cell interference. The inter-cell interference is data dependent. That is, the inter-cell interference depends on a data pattern of the newly written data. To correct the effects of inter-cell interference on data stored in memory cells along a word line, the memory cells along the word line can be read repeatedly. Information obtained by repeatedly reading the memory cells along a word line is used to decode the data stored in the memory cells along the word line.

Effects of inter-cell interference on data stored in memory cells along a word line can be mitigated by reading the memory cells along the word line and also reading memory cells in adjacent word lines. Information obtained by reading memory cells in the adjacent word lines is used to compensate effects of inter-cell interference on data stored in memory cells along the word line. Accordingly, data stored in memory cells along a word line is decoded using information obtained by reading the memory cells along the word line and by reading the memory cells along adjacent word lines.

In FIG. 7A, when data is written to a $j^{th}$ cell in an $i^{th}$ word line (i.e., a cell at an intersection of $j^{th}$ word line and $i^{th}$ bit line), the data is affected by data previously written in one or more neighboring cells. The $j^{th}$ cell in the $i^{th}$ word line that is affected by the neighboring cells is called a victim cell (V). The neighboring cells that affect the victim cell are called aggressor cells (A).

The aggressor cells affect the victim cell due to a coupling between the aggressor cells and the victim cell. The aggressor cells are located adjacent to the victim cell. For example, an aggressor cell can be located in word lines j+1 and/or j−1 adjacent to the word line j in which the victim cell is located. The aggressor cell can also be located in bit lines i−1 and/or i+1 adjacent to the bit line i in which the victim cell is located.

In FIG. 7B, the threshold voltage distribution of a victim cell is a function of the state of one or more aggressor cells. For example only, assume that the cells can store 2-bits-per-cell (i.e., each of the cells can have one of four possible states). Suppose that two victim cells V1 and V2 are affected by two aggressor cells A1 and A2. Suppose, for example only, that the aggressor cell A1 is charged to the highest state (state 4) and that the aggressor cell A2 is charged to the lowest state (state 1). Suppose further, for example only, that the victim cells V1 and V2 are programmed to the second state.

Since the aggressor cell A2 is programmed to the lowest state, the state of the aggressor cell A2 may not interfere with the state of the victim cell V2. Consequently, the threshold voltage distribution of the victim cell V2 will appear normal as shown. Since the aggressor cell A1 is programmed to the highest state, the state of the aggressor cell A1 may interfere with the state of the victim cell V1. Consequently, the threshold voltage distribution of the victim cell V1 may shift to the right as shown. Accordingly, when the victim cells V1 and V2 are read, without knowing the state of the aggressor cells A1 and A2, the threshold voltage distribution of the victim cells V1 and V2 will appear as a single distribution, which in fact is a sum of the two distributions as shown Now suppose that N cells along a word line are programmed to the second state. Each of the N cells will have a neighboring cell. Each of the neighboring cells can have one of four possible states. Accordingly, the N cells can be divided into four groups. A first group of N/4 cells can have neighboring cells programmed to state 1. A second group of N/4 cells can have neighboring cells programmed to state 2. A third group of N/4 cells can have neighboring cells programmed to state 3. A fourth group of N/4 cells can have neighboring cells programmed to state 4.

In FIG. 7C, if the neighboring cells are programmed to state 1, the neighboring cells will have no impact on the threshold voltage distribution of the N cells. Therefore, the threshold voltage distribution of the cells in each of the four groups will appear as normal. The overall threshold voltage distribution of the N cells will be a sum of the distributions of the four groups as shown.

In FIG. 7D, if the neighboring cells are programmed to states 1 through 4, however, the neighboring cells will impact the threshold voltage distribution of the N cells as shown. Therefore, the threshold voltage distribution of the cells in each of the four groups will appear shifted as shown. The overall threshold voltage distribution of the N cells will be a sum of the distributions of the four groups as shown. The threshold voltage distribution of the N/4 cells in the fourth group may have in fact shifted by nearly one state, which will not be detectable by simply detecting the overall distribution unless the states of the neighboring states are taken into consideration.

Therefore, to compensate for inter-cell interference, instead of assigning the same LLR to two cells having the same bin index, a different LLR can be assigned to each cell if the neighboring cell of each cell has a different state. For example, if two victim cells V1 and V2 have the same state (e.g., state 2), and if their respective aggressor cells A1 and A2 have different states (e.g., A1 has state 4, and A2 has state 1), V1 can be assigned a different LLR than V2 to distinguish the threshold voltage distribution of V1 from that of V2 although the overall distribution (and hence the bin index) of V1 and V2 is the same.

Figure 8:
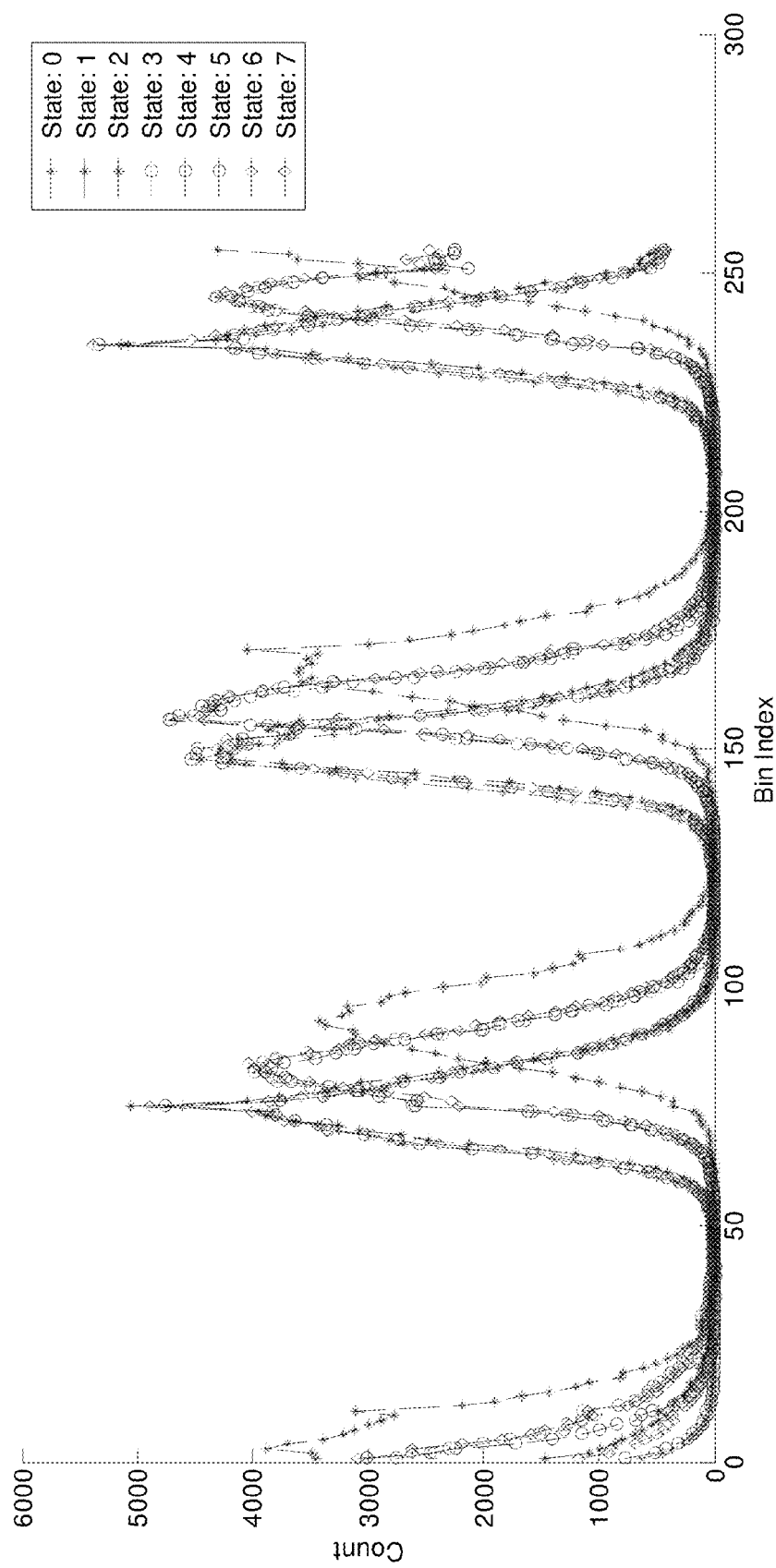
FIG. 8 shows a histogram of bin index.

In FIG. 8, a histogram for a memory device having memory cells capable of storing 3-bits-per-cell is shown. Each cell can have one of eight possible states. Note that instead of a single overall distribution, three distinct threshold voltage distributions can be observed. Also, eight separate distributions corresponding to eight separate states are not observed since cells having some of the states cause similar inter-cell interference.

For example, cells having states 1, 3, 5, and 7 cause similar inter-cell interference; cells having states 0, 4, and 6 cause similar inter-cell interference; and cells having state 2 cause similar inter-cell interference. Accordingly, while the cells can have eight possible states, only three threshold voltage distributions cause inter-cell interference.

The inter-cell interference pattern is device-dependent. That is, the inter-cell interference pattern observed for a memory device is the same for all units of the memory device manufactured using the same process. Further, the inter-cell interference pattern (i.e., a pattern of aggressor cells causing inter-cell interference to victim cells) does not change throughout the life of the memory device although the memory device ages due to usage. The inter-cell interference pattern of a memory device is therefore a signature characteristic of the memory device.

The inter-cell interference pattern of a memory device is based on the programming sequence or order of programming pages that is optimized for the device by the memory device manufacturer. Accordingly, for a memory device, the inter-cell interference pattern can be studied by selecting a victim cell and analyzing impact of one or more aggressor cells. The aggressor cells may be located along the same bit line and/or the same word line as the victim cell. Alternatively or additionally, the aggressor cells may be located along an adjacent word line and/or bit line.

FIGS. 9-22 are used to describe the joint detecting decoding schemes according to the present disclosure. In many NAND flash devices, the read-back channel can be formulated as a channel with memory. For example, the memory may come from the inter-cell interference. That is, due to the floating gate (FG) capacitive coupling, the charge (or the state) in a cell (victim cell) is affected by the charge (or the state) of the cell's neighboring cells (aggressor cells). Also, the memory or bit correlation may come from Gray mapping used to map the bits from different page types in the same bitline into a symbol.

Figure 9:
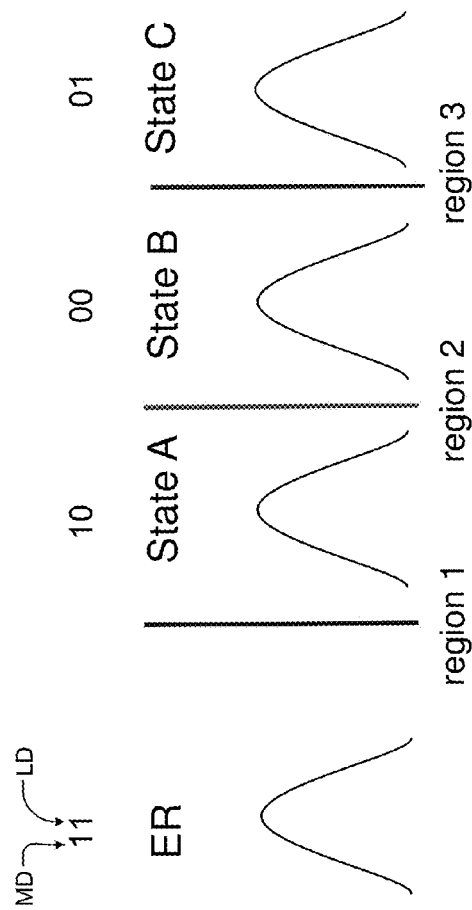
FIG. 9 shows an example of a threshold voltage distribution of a 2-bits-per-cell NAND flash memory cell (i.e., an MLC device).

FIG. 9 shows an example of a threshold voltage distribution of a 2-bits-per-cell NAND flash memory cell (i.e., an MLC device). Based on a readout data obtained from the NAND Flash devices, each cell in a block can have a cell state (or symbol). In the example shown, a cell state can have one of four states: ER (erase), state A, state B, or state C (highest state). These states in FIG. 7B are denoted as state 1, state 2, state 3, and state 4, respectively.

Throughout the present disclosure, unless mentioned otherwise, a first bit (e.g., a left bit) of a 2 bits/cell memory cell is referred to as a maximum distance (MD) bit, and a second bit (e.g., a right bit) of the 2 bits/cell memory cell is referred to as a least distance (LD) bit, as shown in FIG. 9. In a multi-bits-per-cell device, each memory cell can store more than one bit. Different manufacturers may use different conventions in ordering the bits in a memory cell. For example, consider a 2 bits/cell device for which there are three possible reference voltages X, Y, and Z at regions 1, 2, and 3, respectively. A value of one of the bits can be inferred from the reference voltage Y, while a value of the other bit can be inferred from the reference voltages X and Z. The bits in the memory cell can be ordered such that the most significant bit (MSB) for one manufacturer can be the least significant bit (LSB) for another manufacturer, and vice versa. To avoid this ambiguity, in this disclosure, the terms maximum distance (MD) bit and least distance (LD) bit for a 2 bits/cell device are used. An MD bit corresponds to a bit that can be inferred from, for example, the reference voltage Y; and an LD bit corresponds to a bit that can be inferred from the reference voltages X and Z. The MD bit experiences less chance of error, thereby appearing to have greater distance between the adjacent states as compared to the LD bit. The terminology can be generalized to 3 bits/cell devices, which can have an MD bit, a central distance (CD) bit, and an LD bit. More generally, a device with k bits/cell can have k types of bits from 0 to (k−1). In a 2 bits/cell device, the MD bit is of type 0, and the LD bit is of type 1; in a 3 bits/cell device, the MD bit is of type 0, the CD bit is of type 1, and the LD bit is of type 2; and so on.

To read a lower page (MD page), a reference voltage ($V_{ref}$) at region 2 needs to be specified. To read an upper page (LD page), reference voltages at region 1 and region 3 need to be known. For a 3-bits-per-cell NAND flash memory cell (i.e., a TLC device), there are 8 possible cell states: ER, A, B, C, D, E, F, and G. In the following discussion, a cell in a wordline i and bitline j is denoted as cell(i,j).

Figure 10:
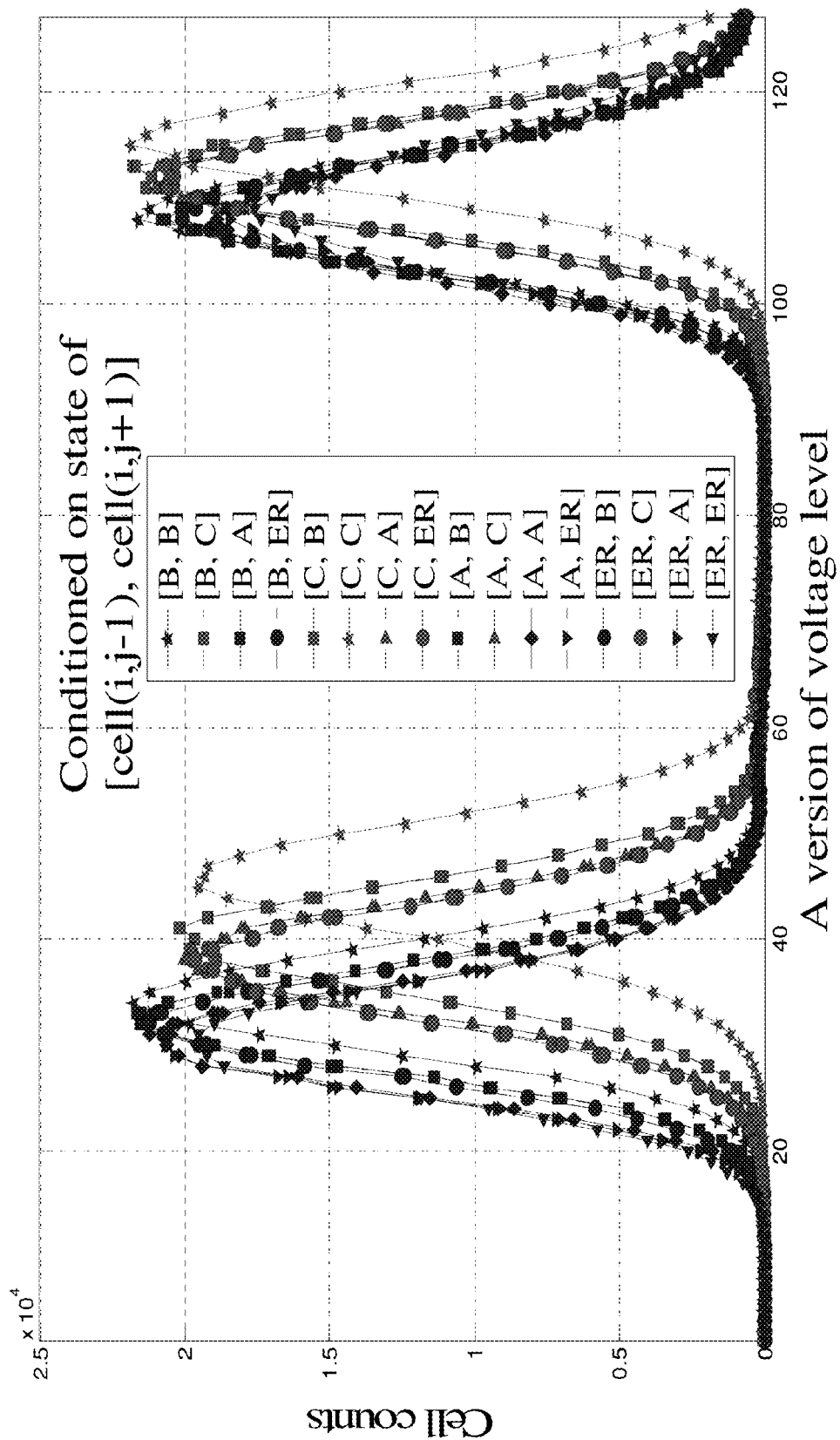
FIG. 10 shows a bin index histogram of a region between state A and state B for a memory device having memory cells capable of storing 2-bits-per-cell, which illustrates inter-cell interference when wordline-level information is available.

FIG. 10 shows a histogram of the region 2 between state A and state B for a memory device having memory cells capable of storing 2-bits-per-cell, which illustrates inter-cell interference when wordline-level information (i.e., states of cells along a wordline) is available. In many NAND flash devices, the voltage distribution of a current cell (i.e., a victim cell) depends on states of one or more neighboring (or aggressor) cells. In an example shown in FIG. 10, conditioned on states of a left cell(i,j−1) and a right cell(i,j+1) in the same wordline i, a current cell (i,j) can have 16 threshold voltage distributions. These 16 threshold voltage distributions can be grouped into three groups as shown: In a first group, no aggressor cell has state C; in a second group, exactly one aggressor cell has state C; and in a third group, both aggressor cells have state C.

In scenarios where only page-level information (i.e., bits of cells along a page) is available, the reliability information of a current bit (i.e., a bit of a victim cell) depends on the threshold voltage distribution of the current cell. This threshold voltage distribution itself depends on the aggressor bits (i.e., bits of aggressor cells neighboring the victim cell along the page).

Figure 11:
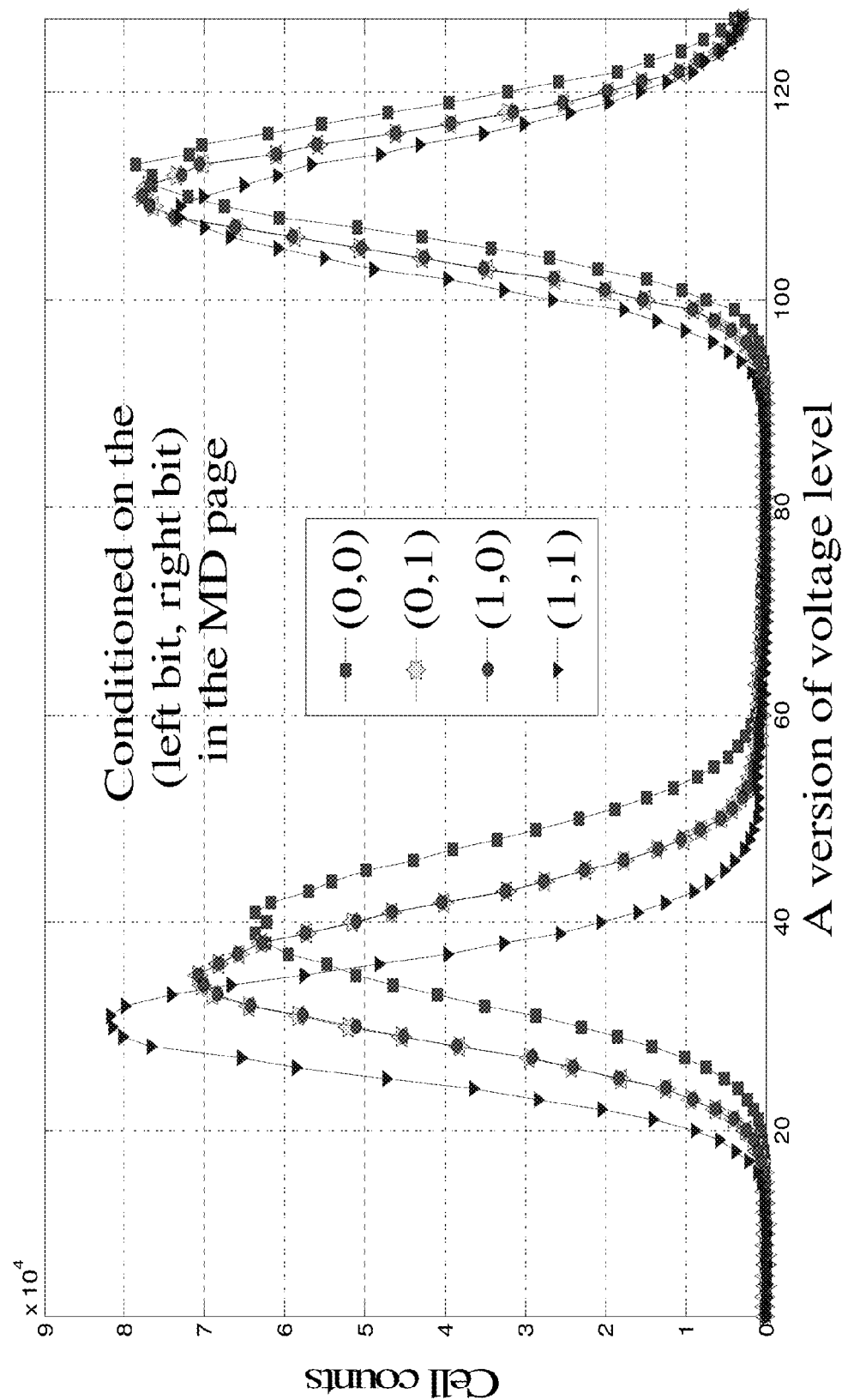
FIG. 11 shows a bin index histogram of a region between state A and state B for a memory device having memory cells capable of storing 2-bits-per-cell, which illustrates inter-cell interference when page-level information is available.

FIG. 11 shows an example of inter-cell interference when only page-level information is available. Assume that data from a MD page (i.e., lower page) is available. Conditioned on the left bit and the right bit, there are four threshold voltage distributions, which can be grouped into three groups in region 2 between state A and state B as shown.

Figure 12:
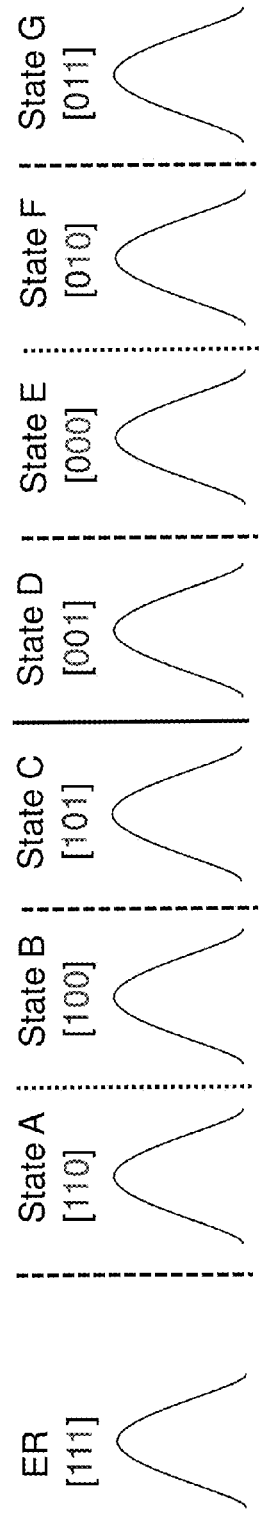
FIG. 12 shows a threshold voltage distribution of a 3-bits-per-cell memory device.

FIG. 12 shows a threshold voltage distribution of a 3-bits-per-cell memory device. In some scenarios where wordline-level information is available, the bits forming a state symbol (i.e., a state of a single cell) may have correlation/memory. In other words, the reliability information (e.g., log-likelihood ratio (LLR)) of one bit in a state of a cell depends on the values all the bits in the state symbol.

For example, in a 3-bits-per-cell device with a first Gray mapping shown in FIG. 12, if a read-back cell state is B (i.e., 100), then the first bit 1 of state B is more reliable than the other two bits 0 and 0 of state B because the bit 1 of state B is in error if and only if the cell is programmed to either state D, E, F, or G which are not the neighboring states of state B.

Figure 1:
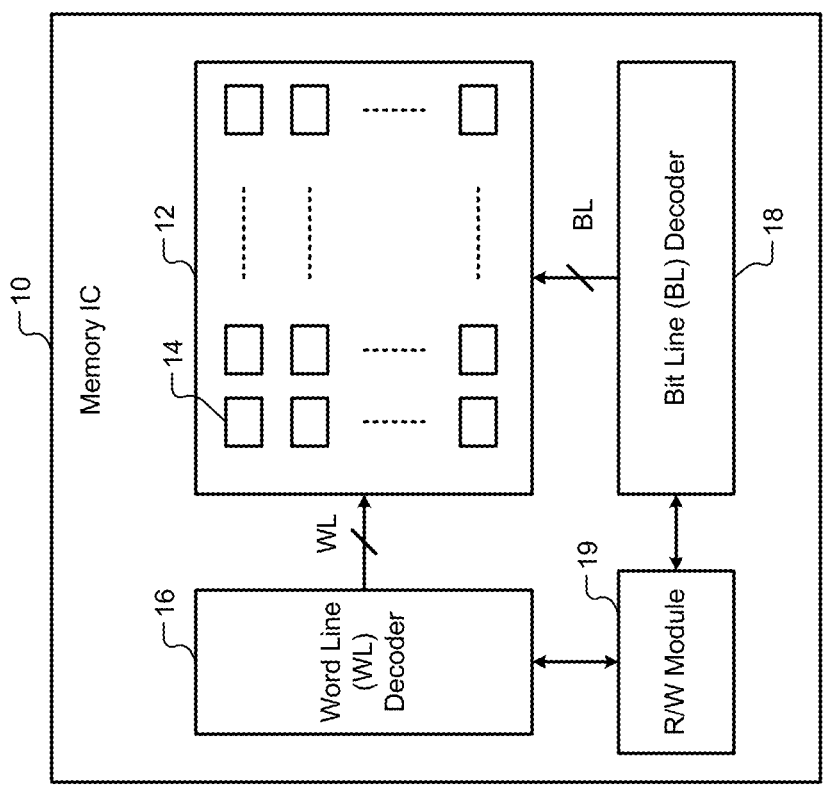
FIG. 1 is a functional block diagram of a memory integrated circuit (IC)
Figure 3A:
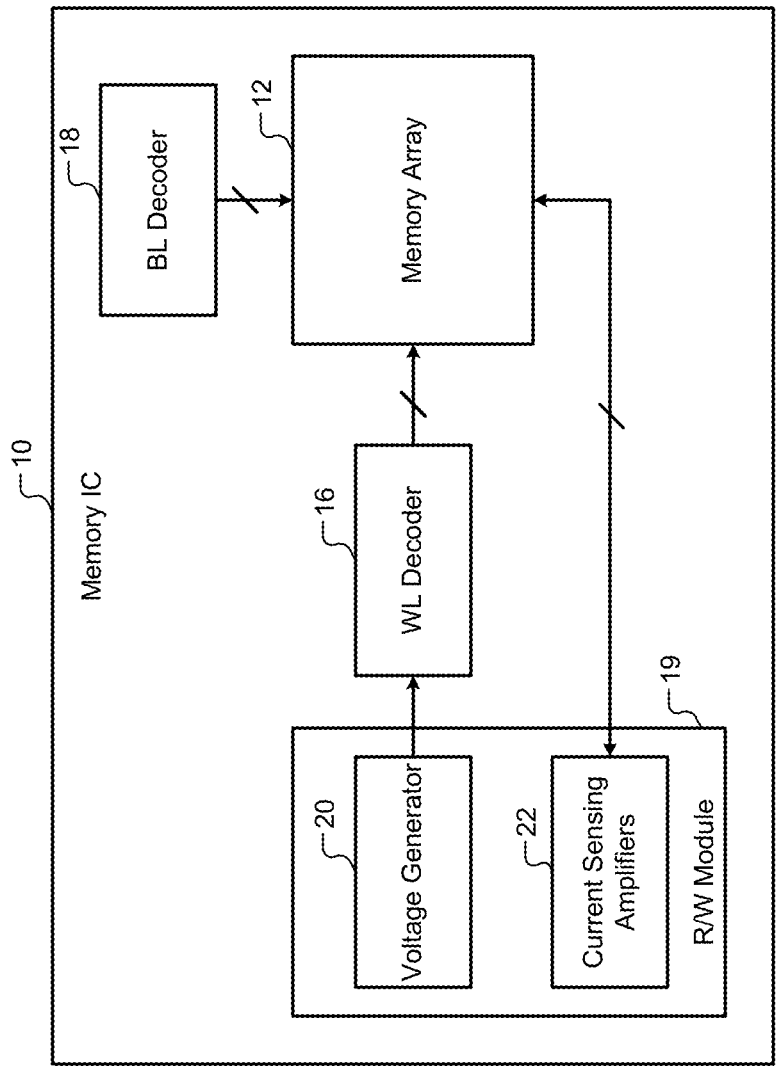
FIGS. 3A and 3B are functional block diagrams of the memory IC of FIG. 1.
Figure 3B:
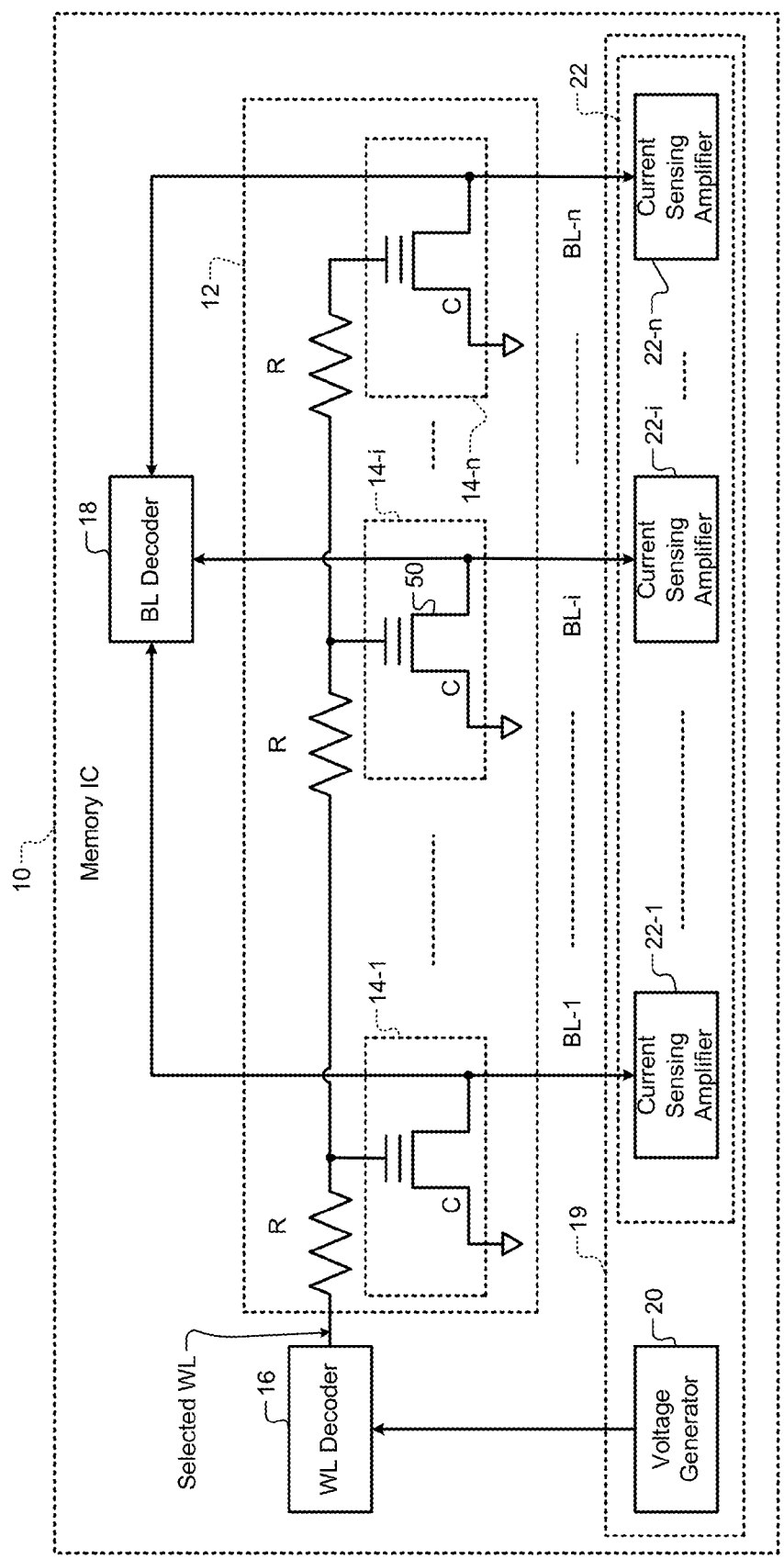

FIGS. 13A and 13B show a read/write (R/W) module 100 that jointly detects and decodes data from the memory cells 14 of the memory array 12 shown in FIG. 1 according to the present disclosure. The R/W module 100 includes a read module 102, a detector 104, and a decoder 106. In FIG. 13B, the detector 104 is shown in greater detail. The detector 104 includes a receiving module 108, a selecting module 110, and a processor 112.

The read module 102 reads the memory cells 14 of the memory array 12. The read module 102 outputs data read from the memory as input data to the detector 104. The detector 104 functions as a detector/preprocessor that processes the input data (i.e., bits if only page-level information is available, or cell states if wordline-level information is available) from the memory and that outputs information including detected bits and reliability information to the decoder 106. The decoder 106 processes the output from the detector 104 and decodes the input data. The decoder 106 can also provide feedback information to the detector 104 according to a predetermined schedule (e.g., after every N decoding iterations for an iterative decoder, where N is an integer greater than or equal to one). The detector 104 can use the feedback information to improve the detection of the input data and the reliability information output to the decoder 106.

In some embodiments, the detector 104 can perform inter-cell interference cancellation (ICIC) on the page-level or wordline-level depending on the type of information is available. In some embodiments, the detector 104 can perform ICIC on the fly (OTF) without issuing re-reads from the memory or affecting throughput of the decoder 106. For example, in some scenarios, if wordline-level information is available, the detector 104 can take the state information of some aggressor cells as well as victim cells and assign one bit or multi bits of reliability to each victim symbol (i.e., state) or bit. These additional reliability bits from ICIC can be provided to the decoder 106 together with the hard-decision and other reliability bits provided by the memory. In some other scenarios where only page-level information is available, the detector 104 can take the bit information of some aggressors as well as current bit (i.e., a bit of a victim cell) to assign reliability information to the current victim bit. In some embodiments, the selecting module 110 may use a sliding-window to select cells/bits within a specified window around the current victim. The processor 112 may process the selected information and output the reliability and/or value for the current cell states or current bits to the decoder 106.

Figure 14:
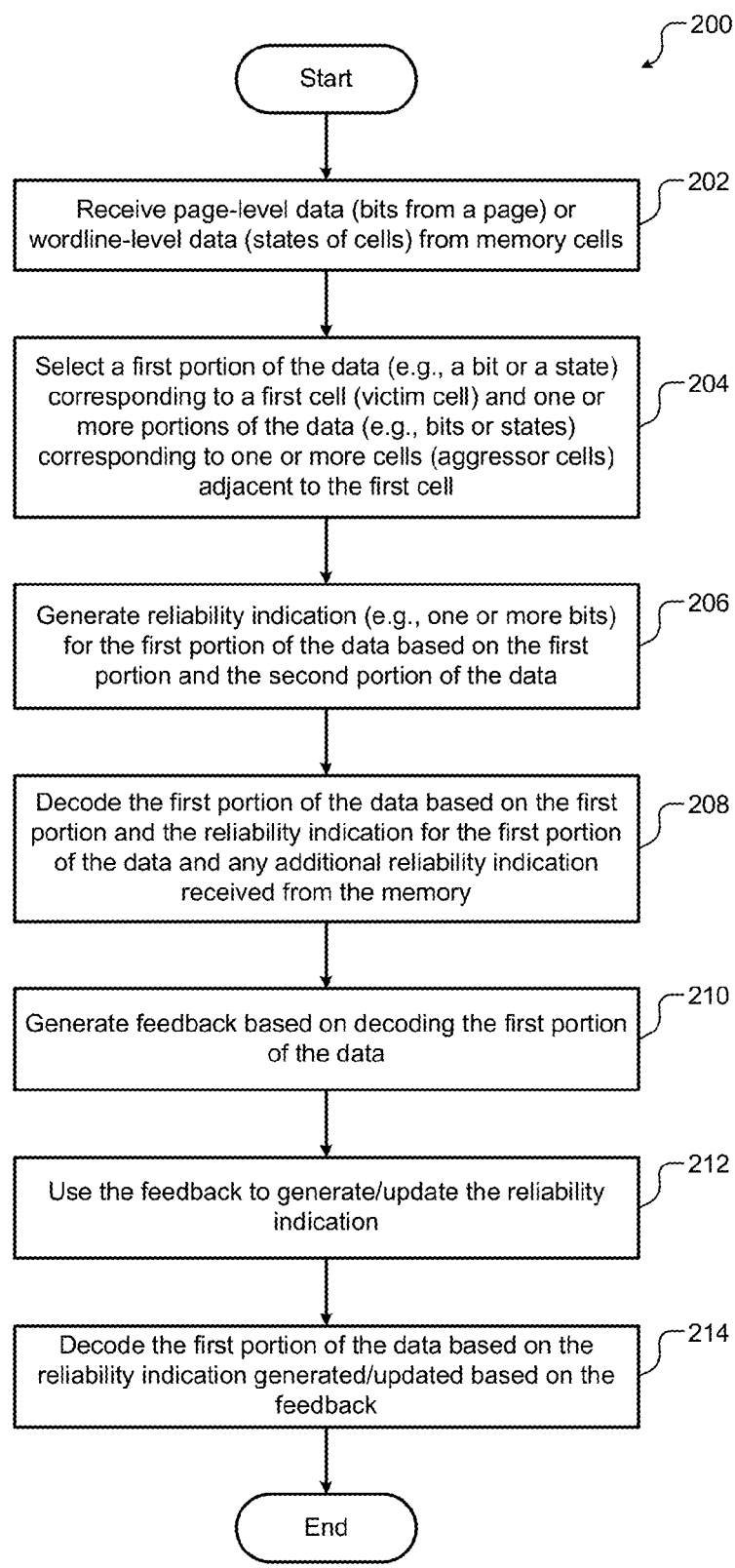
FIG. 14 shows a flowchart of a first method for jointly detecting and decoding data, including various operations performed by a detector and a decoder shown in FIGS. 13A and 13B.

FIG. 14 shows a first method 200 (i.e., the first scheme) of jointly detecting and decoding data, including various operations performed by the detector 104 and the decoder 106 according to the first method 200. At 202, the receiving module 108 receives page-level data (i.e., bits from a page) or wordline-level data (i.e., states of cells along a wordline) from the memory cells. At 204, the selecting module 110 selects a first portion of the data (e.g., a bit or a state) corresponding to a first cell (i.e., a victim cell). The selecting module 110 also selects one or more portions of the data (e.g., bits or states) corresponding to one or more cells (i.e., aggressor cells) that are adjacent to the first cell (e.g., to the left and/or right of the selected bit on a page, or to the left and/or right of the selected cell state along a wordline). For example, the selecting module 110 may use a sliding window to make these selections.

At 206, the processor 112 generates a reliability indication (e.g., one or more bits) for the first portion of the data based on the first portion and the second portion of the data. The processor 112 outputs the first portion of the data and the reliability indication for the first portion of the data to the decoder 106. At 208, the decoder 106 decodes the first portion of the data based on the first portion of the data and the reliability indication for the first portion of the data received from the processor 112. In some embodiments, the decoder 106 may also use any additional reliability indication received from the memory to decode the first portion of the data received from the processor 112.

At 210, the decoder 106 generates feedback information based on decoding the first portion of the data. The decoder 106 may generate the feedback information based on a predetermined schedule (e.g., after every N decoding iterations for an iterative decoder). At 212, the processor 112 uses the feedback information from the decoder 106 to generate or update the reliability indication for the first portion of the data. At 214, the decoder 106 decodes the first portion of the data based on the reliability indication generated or updated by the processor 112 based on the feedback.

Figure 15A:
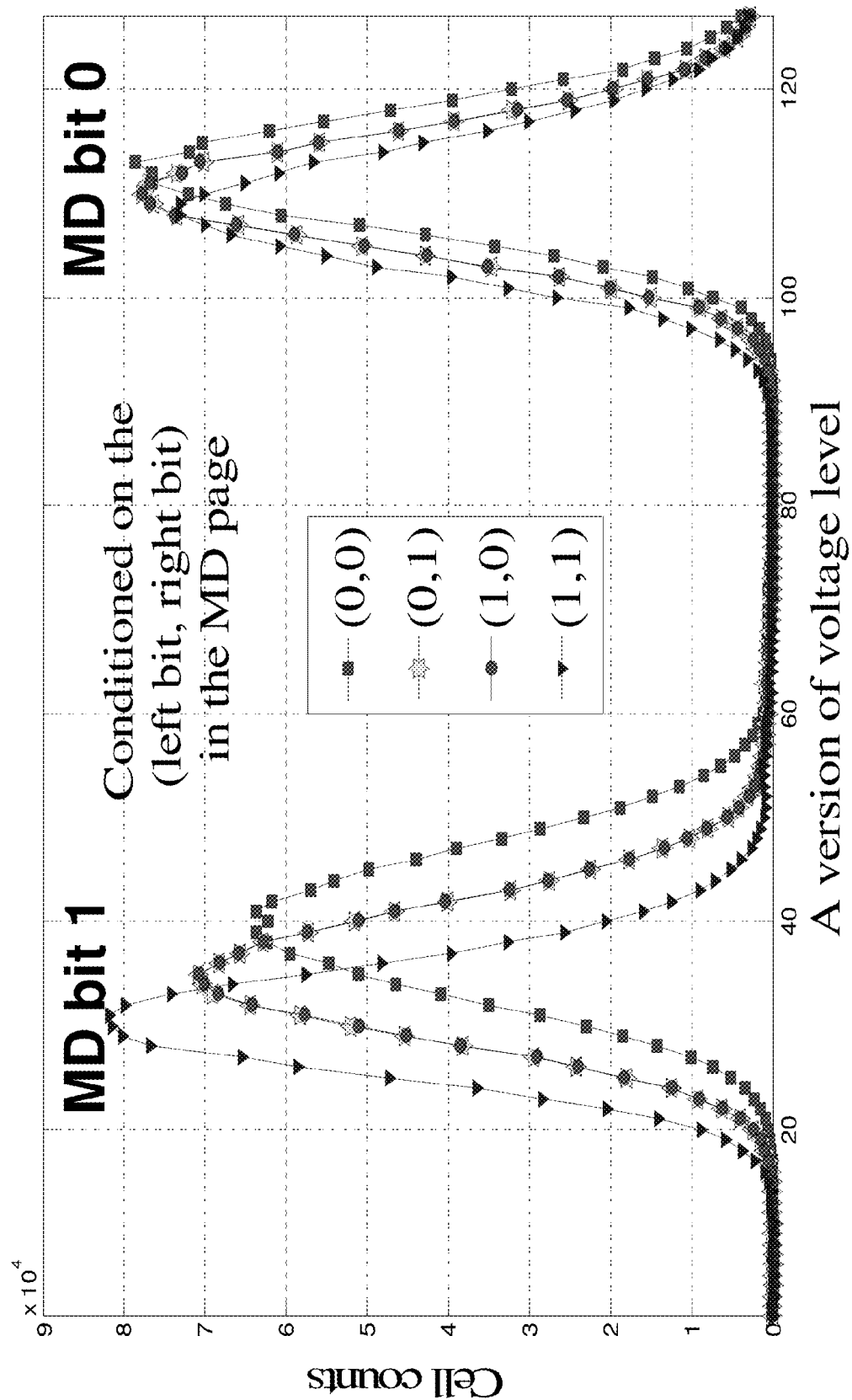
FIG. 15A shows a histogram for a memory device having memory cells capable of storing 2-bits-per-cell.

FIGS. 15A and 15B show an example of the operation of the detector 104 and the decoder 106 when page-level information is available. In FIG. 15A, data from a MD page (i.e., lower page) is shown. Conditioned on the left bit and the right bit, there are four threshold voltage distributions, which can be grouped into three groups in region 2 between state A and state B as shown. In FIG. 15B, the input to the detector 104 is a left bit, a current bit, and a right bit from a page. The detector 104 outputs one hard bit and one soft bit for each current bit to the decoder 106. The detector 104 generates each hard bit and soft bit for each current bit based on the current bit, the left bit, and the right bit. The soft bit indicates the reliability of the hard bit (i.e., the current bit). The detector 104 can include a table (logic) such as that shown in FIG. 15B to output information to the decoder 106. In some other cases, if the whole neighboring cell states are available and/or the decoder 106 can process more bits of soft information, the detector 104 would also include a corresponding table/logic.

Figures 16A, 16B:
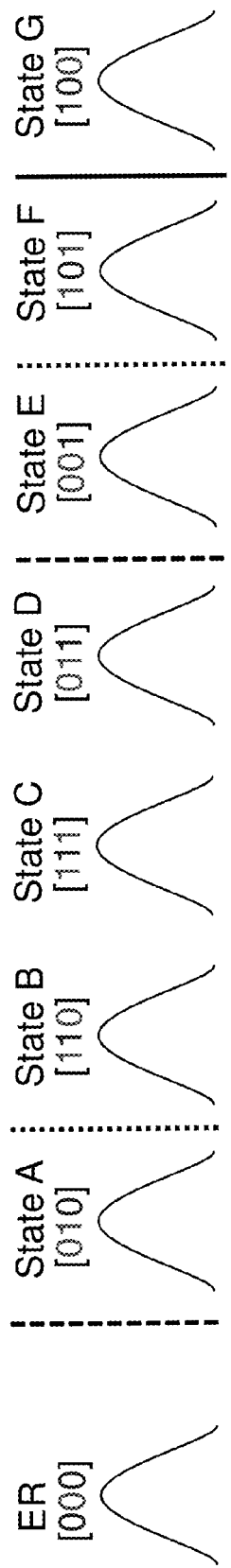
FIG. 16A shows an example of a threshold voltage distribution of a 3-bits-per-cell device using a first Gray mapping.
FIG. 16B shows a table used by the detector shown in FIGS. 13A and 13B for a second method.

FIGS. 16A and 16B show an example of the operation of the detector 104 and the decoder 106 when wordline-level information is available. FIG. 16A shows an example of a threshold voltage distribution of a 3-bits-per-cell device using a first Gray mapping. In some embodiments where the wordline-level information is available, the detector 104 can process each single cell state/symbol and assign reliability to the bits that form the corresponding cell state/symbol based on the Gray mapping used. For example, consider the case where all the three pages in the wordline are available, and the first Gray mapping shown in FIG. 16A is used. In FIG. 16B, for each bit of a state of a cell, a hard bit and a soft bit are generated. The input to the detector 104 includes the bits of a state of a cell. The detector 104 outputs a hard bit and a soft bit for each bit of the state as shown.

For example, suppose that the detector 104 receives state B as an input of a state of a cell. According to the first Gray mapping used, state B includes a first bit 1, a second bit 1, and a third bit 0. For the first bit 1 of state B, corresponding first bits of neighboring states A and C are respectively 0 and 1. Since at least the first bit 0 of state A is different from the first bit 1 of state B, a reliability indication for the first bit 1 of state B is 0 indicating that the first bit 1 of state B is unreliable. For the second bit 1 of state B, corresponding second bits of neighboring states A and C are respectively 1 and 1. Since both corresponding bits of the neighboring states A and C are the same as the first bit 1 of state B, a reliability indication for the second bit 1 of state B is 1 indicating that the first bit 1 of state B is reliable. For the third bit 0 of state B, corresponding third bits of neighboring states A and C are respectively 0 and 1. Since at least the third bit 1 of state C is different from the third bit 0 of state B, a reliability indication for the third bit 0 of state B is 0 indicating that the third bit 0 of state B is unreliable.

Figure 17A:
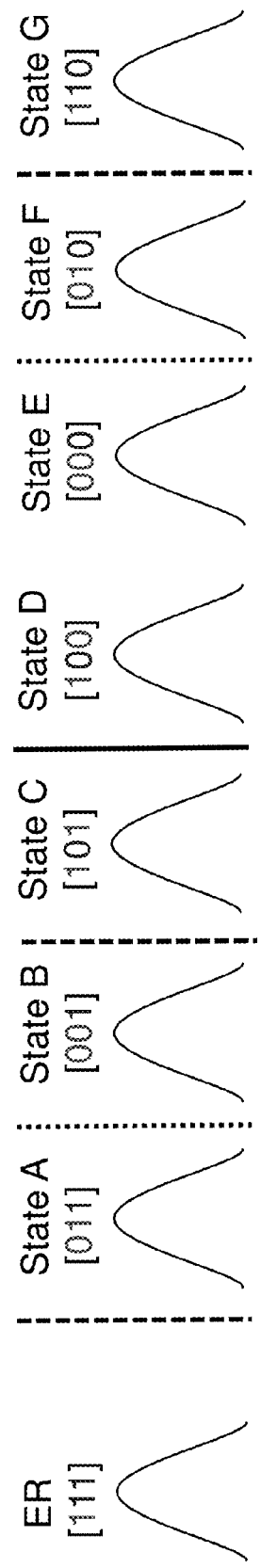
FIGS. 17A and 17B show different examples of Gray mapping.
Figure 17B:
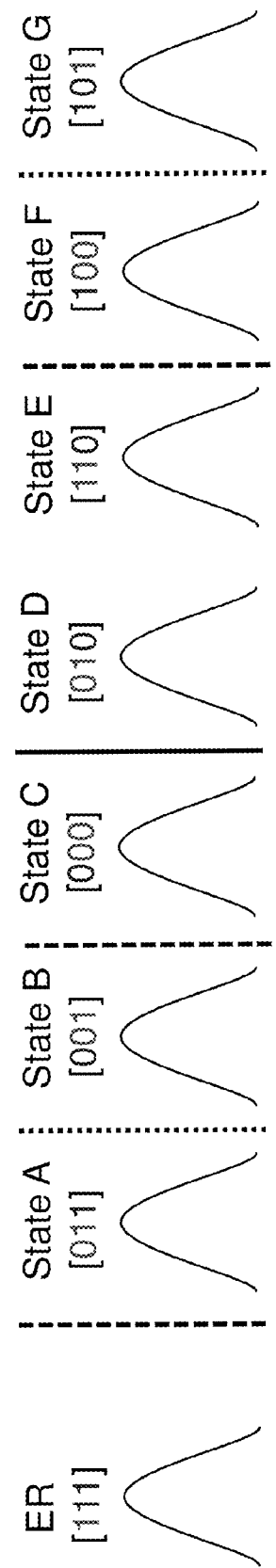

In general, the same principle for the detector 104 can be applied for other multi-bits-per-cell memory devices with different Gray mappings. For example, two other examples of Gray mapping (in addition to the first Gray mapping example shown in FIG. 16A) that can be used for 3-bits-per-cell memory are shown in FIGS. 17A and 17B. For each Gray mapping example shown in FIGS. 17A and 17B, the detector 104 will have a different way of assigning the output bits (i.e., different table/logic from that shown in FIG. 16B).

Figure 18:
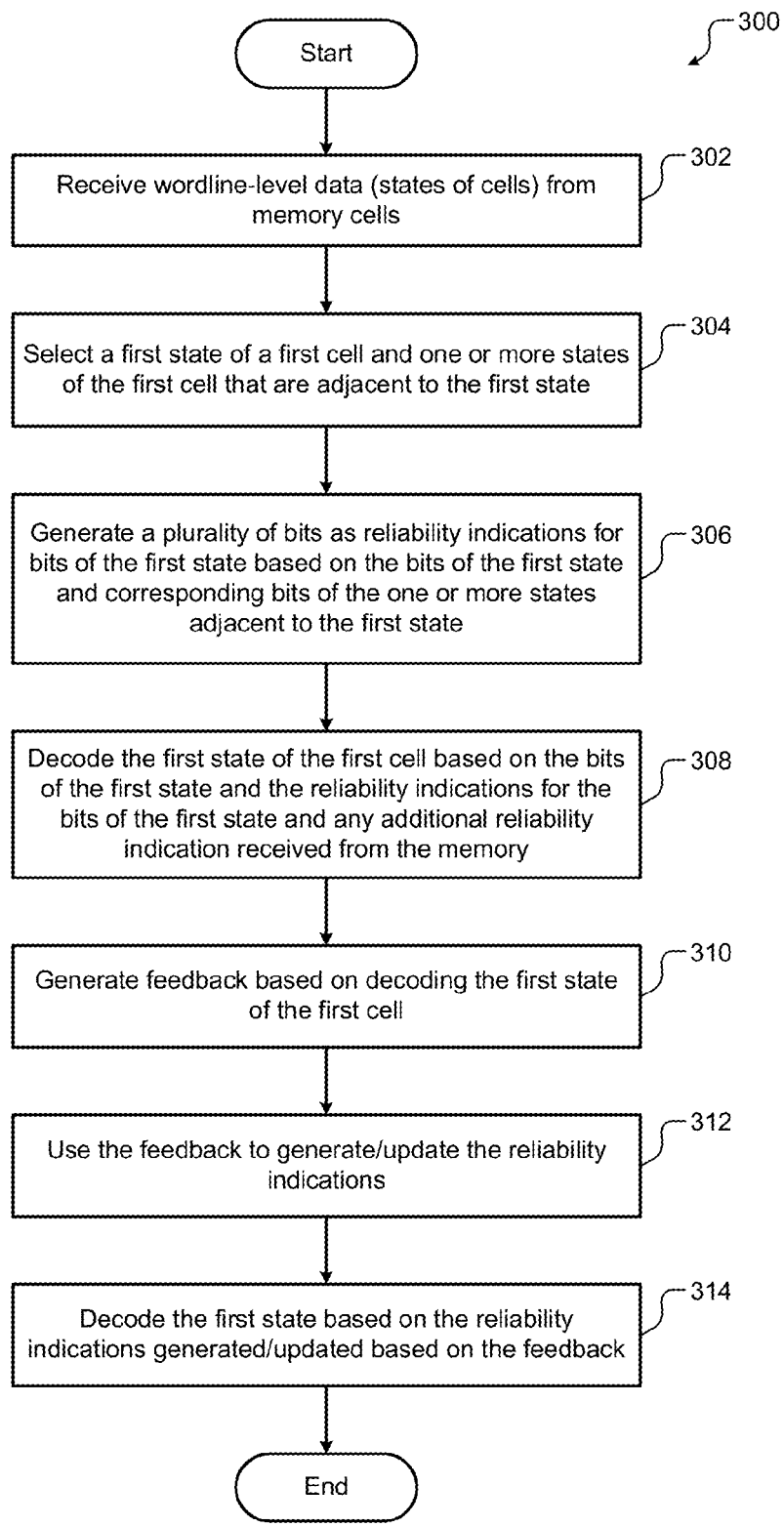
FIG. 18 shows a flowchart of a second method for jointly detecting and decoding data, including various operations performed by a detector and a decoder shown in FIGS. 13A and 13B.

FIG. 18 shows a second method 300 (i.e., the second scheme) of jointly detecting and decoding data, including various operations performed by the detector 104 and the decoder 106 according to the second method 300. At 302, the receiving module 108 receives wordline-level data (i.e., states of cells along a wordline) from the memory cells. At 304, the selecting module 110 selects a first state of each cell and one or more states of the cell that are adjacent to the first state (e.g., to the left and/or right of the selected state). These adjacent states come from the Gray mapping used and are device dependent. In many cases, the table in FIG. 16B could be pre-configured for each device so in the detector there is no need to get the adjacent states of the first state of each cell all the time.

At 306, the processor 112 generates a plurality of bits as reliability indications for bits of the first state based on the bits of the first state and corresponding bits of the one or more states adjacent to the first state. The processor 112 outputs the bits of the first state and the corresponding reliability indications. At 308, the decoder 106 decodes the cell data based on the bits of the first state and the reliability indications for the bits of the first state that are output by the processor 112. In some embodiments, the decoder 106 may also use any additional reliability indication received from the memory to decode the first state of the first cell received from the processor 112. In some embodiments, the decoder 106 can decode each page type data separately in the bit level (e.g., decode MD page, CD page, or LD page). In some other embodiments, the decoder 106 can decode the page type data jointly in the symbol level (i.e., state level).

At 310, the decoder 106 generates feedback information based on decoding the first state of the cells. The decoder 106 may generate the feedback information based on a predetermined schedule (e.g., after every N decoding iterations for an iterative decoder). At 312, the processor 112 uses the feedback information from the decoder 106 to generate or update the reliability indications for the first state of the cells. At 314, the decoder 106 decodes the first state of the cells based on the reliability indications generated or updated by the processor 112 based on the feedback.

In some embodiments, where the hard and soft information from the memory may not be available for use by the decoder 106, the detector 104 can map information received from the memory to the form that the decoder 106 can use. For example, the information from the memory may be as shown in FIG. 19A. Assume that the decoder 106 can understand soft bit 1 as reliable and soft bit 0 as unreliable. Then the detector 104 can include a table/logic as shown in FIG. 19B to make the information from the memory ready for the decoder 106 to use.

For example, suppose that the detector 104 receives data from a lower page of a 2-bits-per-cell device as shown in FIG. 19A. Suppose that the threshold voltage distribution of the cell is divided into four bins as shown. Suppose that the reference voltage used to read the cell is between two adjacent threshold voltages as shown. The input to the detector 104 are bits representing the bin index as shown in FIG. 19B. That is, the detector 104 receives two bits corresponding to a bin in which a threshold voltage of the cell lies as indicated by reading the cell using the reference voltage. The detector 104 may derive or infer the two bits from the bin information received from memory as shown in FIG. 19A. The detector 104 uses a table/logic such as that shown in FIG. 19B to generate a hard bit and a soft bit indicating a reliability of the hard bit that are output to the decoder 106.

As shown in the example, bins 1 and 2 are unreliable because the state of the cell cannot be reliably determined to be 1 or 0 if the threshold voltage of the cell lies in bins 1 or 2 when the cell is read using the reference voltage. Therefore, if the input to the detector 104 is the bin index for bin 1 (i.e., bits 0 and 1), the detector 104 outputs a hard bit 1 since bin 1 is to the left of the reference voltage, and a soft bit 0 indicating that the hard 1 bit is unreliable. Similarly, if the input to the detector 104 is the bin index for bin 2 (i.e., bits 1 and 0), the detector 104 outputs a hard bit 0 since bin 2 is to the right of the reference voltage, and a soft bit 0 indicating that the hard bit 0 is unreliable.

On the other hand, as shown in the example, bins 0 and 3 are reliable because the state of the cell can be reliably determined to be 1 or 0 if the threshold voltage of the cell lies in bins 0 and 3 when the cell is read using the reference voltage. Therefore, if the input to the detector 104 is the bin index for bin 0 (i.e., bits 0 and 0), the detector 104 outputs a hard bit 1 since bin 0 is to the left of the reference voltage, and a soft bit 1 indicating that the hard bit 1 is reliable. Similarly, if the input to the detector 104 is the bin index for bin 3 (i.e., bits 1 and 1), the detector 104 outputs a hard bit 0 since bin 3 is to the right of the reference voltage, and a soft bit 1 indicating that the hard bit 0 is reliable.

Figure 20:
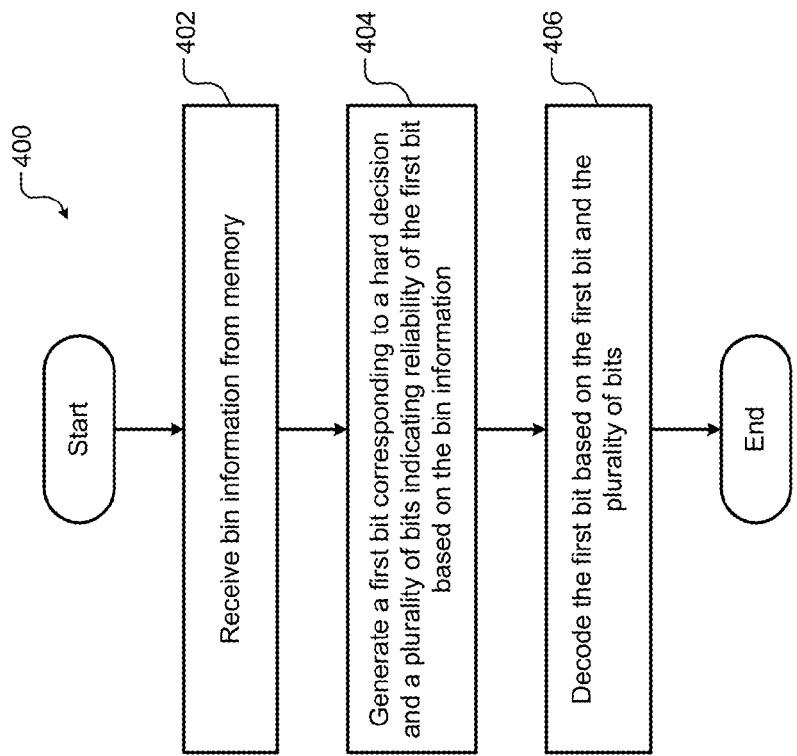
FIG. 20 shows a flowchart of a third method for jointly detecting and decoding data, including various operations performed by a detector and a decoder shown in FIGS. 13A and 13B.

FIG. 20 shows a third method 400 (i.e., the third scheme) of jointly detecting and decoding data, including various operations performed by the detector 104 and the decoder 106 according to the third method 400. At 402, the receiving module 108 receives bin information from memory (some memory devices may have a built-in soft information interface that allows reading out the bin information instead of just the hard-decision). At 404, the processor 112 generates a first bit corresponding to a hard-decision and a plurality of bits indicating the reliability of the first bit based on the bin information. At 406, the decoder 106 decodes the first bit based on the first bit and the plurality of bits. In this third method, there is no need to use the feedback from the decoder to detector. The detector in this case just performs as a one-shot mapping to make the hard decision and the reliability bits in the correct form usable by the decoder.

In some embodiments, the detector 104 can also perform histogram collection of the cell threshold voltage distribution. For example, the detector 104 can collect bin counts based on the information read from the memory. The histogram can be used by firmware to perform Vref management. In some embodiments, the detector 104 can perform Vref calibration on-the-fly and output modified hard bit and soft bit to the decoder 106 based on an estimated Vref offset. An example is shown in FIGS. 21A and 21B.

In FIG. 21A, for example, suppose that the detector 104 receives data from a lower page of a 2-bits-per-cell device as shown. Suppose that the threshold voltage distribution of the cell is divided into four bins as shown. Suppose that the reference voltage used to read the cell is between two adjacent threshold voltages as shown. The input to the detector 104 includes two bits representing a bin as shown in FIG. 21B among which one bit is for the hard decision and the other is for soft information. That is, the detector 104 receives two bits corresponding to a bin in which a threshold voltage of the cell lies as indicated by reading the cell using the reference voltage. The detector 104 may derive or infer the new two bits from the bin information received from memory as shown in FIG. 21A. The detector 104 uses a table/logic such as that shown in FIG. 21B to generate a new hard bit and a new soft bit indicating a reliability of the hard bit that are output to the decoder 106.

As shown in the example, due to a shift in the threshold voltage distribution of a cell (e.g., due to cycling of memory etc.), the original hard bit and soft bit at the input of the detector 104 may not have a good quality. The detector 104 can generate a new hard bit and soft bit to improve the quality of the input data to the decoder 106. The original hard bit and soft bit at the input of the detector 104 can be understood as follows. Bins 1 and 2 may be unreliable because the state of the cell cannot be reliably determined to be 1 or 0 if the threshold voltage of the cell lies in bins 1 or 2 when the cell is read using the reference voltage. Therefore, for bin 1, the hard bit is thought to be 1 since bin 1 is to the left of the reference voltage, and the soft bit is 0 indicating that the hard bit is unreliable. Similarly, for bin 2 (i.e., bits 0 and 0), the hard bit is 0 since bin 2 is to the right of the reference voltage, and the soft bit is 0 indicating that the hard bit is unreliable. The detector 104 will try to output a better hard bit and soft bit. For example, the hard bit in bin 2 is 0 before the detector but will be 1 after the detector.

The detector 104 also collects bin counts (i.e., a number of cells whose threshold voltages lie in each bin when the cells are read using the reference voltage). Based on the bin counts, the detector 104 estimates an offset that can be used to adjust the reference voltage. As shown in FIG. 21A, the offset is between the used Vref and the "would-be" optimal Vref, which is usually at the intersection of the two bell shapes (voltage distributions). The detector 104 effectively calibrates the reference voltage by adjusting the reference voltage based on the estimated offset. With the calibrated reference voltage, the detector 104 can improve the reliability of the bin information that was deemed unreliable prior to the calibration. In some embodiments, this calibration and selection of a table in FIG. 21B can be done on the fly without the need of issuing a re-read with the calibrated reference voltage.

For example, if the input to the detector 104 includes bits corresponding to the bin index for bin 1 (i.e., bits 1 and 0), instead of outputting a hard bit 1 and a soft bit 0, due to the calibrated reference voltage, the detector 104 outputs a hard bit 1 and a soft bit 1 indicating that the hard bit 1 is reliable as shown in FIG. 21B. Similarly, if the input to the detector 104 includes bits corresponding to the bin index for bin 2 (i.e., bits 0 and 0), instead of outputting a hard bit 0 and a soft bit 0, the detector 104 outputs a hard bit 1 since the hard decision with the calibrated reference voltage is more likely to be a 1, but outputs a soft bit 0, indicating that the hard bit 1 is still unreliable.

As shown in the example, bins 0 and 3 are reliable because the state of the cell can be reliably determined to be 1 or 0 if the threshold voltage of the cell lies in bins 0 and 3 when the cell is read using the reference voltage. Therefore, if the input to the detector 104 includes bits corresponding to the bin index for bin 0 (i.e., bits 1 and 1), the detector 104 outputs a hard bit 1 since bin 0 is to the left of the reference voltage, and a soft bit 1 indicating that the hard bit 1 is reliable. Similarly, if the input to the detector 104 includes bits corresponding to the bin index for bin 3 (i.e., bits 0 and 1), the detector 104 outputs a hard bit 0 since bin 3 is to the right of the reference voltage, and a soft bit 1 indicating that the hard bit 0 is reliable.

Figure 22:
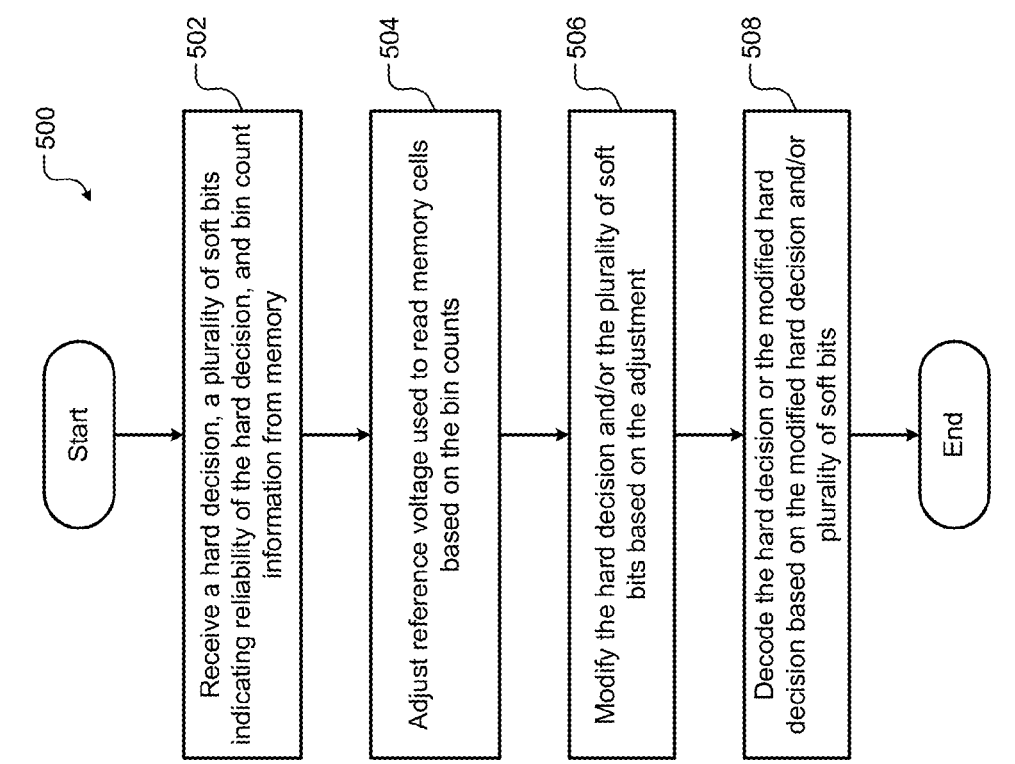
FIG. 22 shows a flowchart of a fourth method for jointly detecting and decoding data, including various operations performed by a detector and a decoder shown in FIGS. 13A and 13B.

FIG. 22 shows a fourth method 500 (i.e., the fourth scheme) of jointly detecting and decoding data, including various operations performed by the detector 104 and the decoder 106 according to the fourth method 500. At 502, the receiving module 108 receives bin information from which a hard decision) and a plurality of soft bits indicating reliability of the hard decision can be derived or inferred.

The detector 104 may perform bin counting based on the page data read from the memory. In some embodiments, the collected bin count can be pushed into some FIFO for the firmware to perform Vref calibration. In some other embodiments, the detector 104 can perform Vref calibration and adjust the hard bit and soft bits on the fly. At 504, the processor 112 adjusts the reference voltage used to read the memory cells based on the bin counts. At 506, the processor 112 modifies one or more of the hard decision and the plurality of soft bits based on the adjustment and outputs data including the hard decision and the soft bits (one or more of which may be modified or unmodified depending on the bin information received and its relationship to the reference voltage used to obtain the bin information). FIG. 21A just illustrates an example of 1 hard bit and 1 soft bit. In general, there can be 1 hard bit and more soft bits if more reference voltages are used. At 508, the decoder 106 decodes the hard decision or the modified hard decision based on the data received from the processor 112. Feedback is not needed in this method/scheme.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:

1. A system comprising:
   a receiving module configured to receive data from cells of memory, wherein each of the cells stores multiple bits, wherein each of the bits corresponds to a different type of page of the memory, wherein the bits stored in one of the cells denote a state of the one of the cells, and wherein the data includes (i) bits from a page of the memory or (ii) states of cells along a word line of the memory;
   a processor configured to generate a reliability indication for a first portion of the data corresponding to a first cell based on (i) the first portion of the data and (ii) one or more second portions of the data corresponding to one or more of the cells that are adjacent to the first cell; and
   a decoder configured to decode the first portion of the data based on (i) the first portion of the data and (ii) the reliability indication for the first portion of the data.

2. The system of claim 1, wherein the decoder is configured to decode the first portion of the data based on an additional reliability indication for the first portion of the data received from the memory.

3. The system of claim 1, wherein in response to the data including bits from a page of the memory:
   the first portion of the data includes a first bit corresponding to the first cell received from the page;
   the one or more second portions of the data include one or more bits corresponding to the one or more of the cells received from the page; and
   the processor is configured to generate the reliability indication for the first bit based on (i) the first bit and (ii) the one or more bits.

4. The system of claim 1, wherein in response to the data including states of cells along a word line of the memory:
   the first portion of the data includes a first state of the first cell along the word line;
   the one or more second portions of the data includes one or more states of the one or more of the cells along the word line; and
   the processor is configured to generate a plurality of bits as the reliability indication for each of the bits of the first state based on (i) the bits of the first state and (ii) corresponding bits of the one or more states.

5. The system of claim 1, further comprising a selecting module configured to select the first portion and the one or more second portions of the data using a sliding window.

6. The system of claim 1, wherein:
   the decoder is configured to generate feedback based on decoding the first portion of the data;
   the processor is configured to generate the reliability indication for the first portion of the data based on (i) the first portion and the one or more second portions of the data and (ii) the feedback; and the decoder is configured to decode the first portion of the data based on (1) the first portion of the data and (ii) the reliability indication for the first portion of the data.

7. The system of claim 1, wherein:
the decoder is configured to generate feedback based on decoding the first portion of the data;
the processor is configured to update the reliability indication for the first portion of the data based on the feedback; and
the decoder is configured to decode the first portion of the data based on (i) the first portion of the data and (ii) the updated reliability indication for the first portion of the data.

8. The system of claim 1, wherein:
the processor is configured to generate a plurality of bits as reliability indications for bits of a first state of a first cell based on (i) the bits of the first state and (ii) corresponding bits of one or more states of the first cell that are adjacent to the first state of the first cell; and
the decoder is configured to decode the first state of the first cell based on (i) the first state of the first cell received from the data and (ii) the reliability indications for the bits of the first state of the first cell.

9. A method comprising:
receiving data from cells of memory, wherein each of the cells stores multiple bits, wherein each of the bits corresponds to a different type of page of the memory, wherein the bits stored in one of the cells denote a state of the one of the cells, and wherein the data includes (i) bits from a page of the memory or (ii) states of cells along a word line of the memory;
generating a reliability indication for a first portion of the data corresponding to a first cell based on (i) the first portion of the data and (ii) one or more second portions of the data corresponding to one or more of the cells that are adjacent to the first cell; and
decoding the first portion of the data based on (i) the first portion of the data and (ii) the reliability indication for the first portion of the data.

10. The method of claim 9, further comprising decoding the first portion of the data based on an additional reliability indication for the first portion of the data received from the memory.

11. The method of claim 9, wherein in response to the data including bits from a page of the memory, the first portion of the data includes a first bit corresponding to the first cell received from the page, and the one or more second portions of the data include one or more bits corresponding to the one or more of the cells received from the page, the method further comprising generating the reliability indication for the first bit based on (i) the first bit and (ii) the one or more bits.

12. The method of claim 9, wherein in response to the data including states of cells along a word line of the memory, the first portion of the data includes a first state of the first cell along the word line, and the one or more second portions of the data includes one or more states of the one or more of the cells along the word line, the method further comprising generating a plurality of bits as the reliability indication for each of the bits of the first state based on (i) the bits of the first state and (ii) corresponding bits of the one or more states.

13. The method of claim 9, further comprising selecting the first portion and the one or more second portions of the data using a sliding window.

14. The method of claim 9, further comprising:
generating feedback based on decoding the first portion of the data;
generating the reliability indication for the first portion of the data based on (i) the first portion and the one or more second portions of the data and (ii) the feedback; and
decoding the first portion of the data based on (i) the first portion of the data and (ii) the reliability indication for the first portion of the data.

15. The method of claim 9, further comprising:
generating feedback based on decoding the first portion of the data;
updating the reliability indication for the first portion of the data based on the feedback; and
decoding the first portion of the data based on (i) the first portion of the data and (ii) the updated reliability indication for the first portion of the data.

16. The method of claim 9, further comprising:
generating a plurality of bits as reliability indications for bits of a first state of a first cell based on (i) the bits of the first state and (ii) corresponding bits of one or more states of the first cell that are adjacent to the first state of the first cell; and
decoding the first state of the first cell based on (i) the first state of the first cell received from the data and (ii) the reliability indications for the bits of the first state of the first cell.

* * * * *